US009892782B1

(12) United States Patent
Nagey

(10) Patent No.: US 9,892,782 B1
(45) Date of Patent: *Feb. 13, 2018

(54) DIGITAL TO ANALOG CONVERTERS AND MEMORY DEVICES AND RELATED METHODS

(71) Applicant: Peter K. Nagey, Tempe, AZ (US)

(72) Inventor: Peter K. Nagey, Tempe, AZ (US)

(73) Assignee: Terra Prime Technologies, LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/452,681

(22) Filed: Mar. 7, 2017

Related U.S. Application Data

(63) Continuation-in-part of application No. 14/988,088, filed on Jan. 5, 2016, now Pat. No. 9,589,633, which is a continuation-in-part of application No. 14/325,675, filed on Jul. 8, 2014, now Pat. No. 9,269,427, which is a continuation of application No. 13/481,102, filed on May 25, 2012, now Pat. No. 8,773,887.

(60) Provisional application No. 61/519,557, filed on May 25, 2011.

(51) Int. Cl.
*G11C 11/16* (2006.01)
*G11C 13/00* (2006.01)
*H03M 1/66* (2006.01)

(52) U.S. Cl.
CPC ...... *G11C 13/0026* (2013.01); *G11C 13/0028* (2013.01); *G11C 13/0038* (2013.01); *H03M 1/66* (2013.01)

(58) Field of Classification Search
CPC .......................... G11C 13/0069; G11C 11/16

USPC .................................................. 365/148, 158
See application file for complete search history.

(56) References Cited

U.S. PATENT DOCUMENTS

| | | | | |
|---|---|---|---|---|
| 5,508,958 A | * | 4/1996 | Fazio | G11C 11/5621 |
| | | | | 365/168 |
| 5,812,447 A | * | 9/1998 | Inoue | G11C 7/16 |
| | | | | 365/168 |
| 6,016,370 A | * | 1/2000 | Hatakeyama | G06T 3/40 |
| | | | | 358/3.07 |

(Continued)

OTHER PUBLICATIONS

Vishal Saxena, "DAC Architectures," published online at least as early as Aug. 20, 2015, available online at http://www.umerink.com/courses/ECE614/Handouts/DAC%20Architectures.pdf, last visited Mar. 7, 2017.

*Primary Examiner* — Michael Tran
(74) *Attorney, Agent, or Firm* — Law Office of Paul B. Johnson; Paul Johnson

(57) ABSTRACT

A digital-to-analog converter (DAC) and memory device includes an array of memory cells including resistive memory elements programmable between a high resistive and low resistive state. In implementations the array of memory cells is segmented into unary and binary coded sub-arrays. The device includes a binarizer configured to couple to the memory array to assign binary weights, or segmented unary and binary weights, to currents through a plurality of memory cells or voltages across a plurality of memory cells. The memory device further includes a summer to sum the weighted outputs of the binarizer. A current to voltage converter coupled with the summer generates an analog output voltage corresponding with digital data stored in a plurality of memory cells.

20 Claims, 17 Drawing Sheets

(56) References Cited

U.S. PATENT DOCUMENTS

| | | | |
|---|---|---|---|
| 6,032,220 A | 2/2000 | Martin et al. | |
| 6,130,633 A * | 10/2000 | Lee | H03M 3/50 |
| | | | 341/143 |
| 6,222,474 B1 | 4/2001 | Fattaruso et al. | |
| 6,332,045 B1 * | 12/2001 | Sawada | G06T 5/002 |
| | | | 382/261 |
| 6,396,733 B1 | 5/2002 | Lu et al. | |
| 6,445,612 B1 | 9/2002 | Naji | |
| 6,647,064 B1 | 11/2003 | Eguchi | |
| 6,718,499 B1 | 4/2004 | Zuras, Jr. | |
| 6,765,820 B2 | 7/2004 | Lu et al. | |
| 6,807,124 B2 | 10/2004 | Tsuda et al. | |
| 7,266,732 B2 | 9/2007 | Smith et al. | |
| 7,286,423 B2 | 10/2007 | Ramaraju | |
| 7,286,429 B1 | 10/2007 | Liaw et al. | |
| 7,321,507 B2 | 1/2008 | Yang et al. | |
| 7,343,083 B2 | 3/2008 | Mishima et al. | |
| 7,443,737 B2 | 10/2008 | Chu et al. | |
| 7,679,973 B2 | 3/2010 | Chu et al. | |
| 7,852,662 B2 | 12/2010 | Yang et al. | |
| 7,957,207 B2 | 6/2011 | Parkinson | |
| 8,040,719 B2 | 10/2011 | Cho et al. | |
| 8,289,764 B2 | 10/2012 | Hanzawa | |
| 8,537,043 B1 * | 9/2013 | McLachlan | H03K 17/063 |
| | | | 327/172 |
| 8,594,205 B2 | 11/2013 | Jafarkhani et al. | |
| 8,660,183 B2 | 2/2014 | Miyaji et al. | |
| 8,958,479 B2 | 2/2015 | Mochizuki et al. | |
| 2007/0279368 A1 | 12/2007 | Shefter | |
| 2008/0310236 A1 * | 12/2008 | Baker | G11C 11/5642 |
| | | | 365/185.21 |
| 2010/0188148 A1 * | 7/2010 | Mehta | H03F 1/3247 |
| | | | 330/149 |
| 2011/0080769 A1 | 4/2011 | Chen et al. | |
| 2012/0026039 A1 * | 2/2012 | Ganeshan | G01S 19/33 |
| | | | 342/357.73 |

* cited by examiner

400e ↗

Sequential Physical Code Map

| Cycle# | Stored Left DAC | Converted Right DAC | Cycle# | Converted Left DAC | Stored Right DAC | Cycle# | Stored Left DAC | Converted Right DAC |
|---|---|---|---|---|---|---|---|---|
| 1 | 000011 | not valid | 5 | 000011 | 000111 | 9 | 001011 | 000111 |
| 2 | 000100 | not valid | 6 | 000100 | 001000 | 10 | 001100 | 001000 |
| 3 | 000101 | not valid | 7 | 000101 | 001001 | 11 | 001101 | 001001 |
| 4 | 000110 | not valid | 8 | 000110 | 001010 | 12 | 001110 | 001010 |

Random Physical Code Map

| Cycle# | Stored Left DAC | Converted Right DAC | Cycle# | Converted Left DAC | Stored Right DAC | Cycle# | Stored Left DAC | Converted Right DAC |
|---|---|---|---|---|---|---|---|---|
| 1 | 001011 | not valid | 5 | 001011 | 111000 | 9 | 011110 | 111000 |
| 2 | 000100 | not valid | 6 | 000100 | 001001 | 10 | 001111 | 001001 |
| 3 | 011111 | not valid | 7 | 011111 | 111010 | 11 | 000101 | 111010 |
| 4 | 000110 | not valid | 8 | 000110 | 001011 | 12 | 111110 | 001011 |

Sequential Physical Code Map

| Cycle# | Stored Rbit5,4,3 | Converted Rbit2,1,0 | Cycle | Converted Rbit5,4,3 | Stored Rbit2,1,0 |
|---|---|---|---|---|---|
| 1 | 000 | not valid | 2 | 000 | 001 |
| 3 | 010 | 001 | 4 | 010 | 011 |
| 5 | 100 | 011 | 6 | 100 | 101 |
| 7 | 110 | 101 | 8 | 110 | 111 |
| 9 | xxx | 111 | | | |

Random Physical Code Map

| Cycle# | Stored Rbit5,4,3 | Converted Rbit2,1,0 | Cycle# | Converted Rbit5,4,3 | Stored Rbit2,1,0 |
|---|---|---|---|---|---|
| 1 | 001 | not valid | 2 | 001 | 011 |
| 3 | 010 | 011 | 4 | 010 | 101 |
| 5 | 110 | 101 | 6 | 110 | 100 |
| 7 | 111 | 100 | 8 | 111 | 000 |
| 9 | xxx | 000 | | | |

FIG. 5b

DIGITAL TO ANALOG CONVERTERS AND MEMORY DEVICES AND RELATED METHODS

CROSS REFERENCE TO RELATED APPLICATIONS

This document is a continuation in part application of U.S. Nonprovisional Utility application Ser. No. 14/988,088, titled "Memory Devices and Related Methods," naming as first inventor Peter K. Nagey, filed Jan. 5, 2016 and issued Mar. 7, 2017 as U.S. Pat. No. 9,589,633, which is a continuation in part of U.S. Nonprovisional Utility application Ser. No. 14/325,675, titled "Memory Devices and Related Methods," naming as first inventor Peter K. Nagey, filed Jul. 8, 2014 and issued Feb. 23, 2016 as U.S. Pat. No. 9,269,427, which is a continuation application of U.S. Utility Nonprovisional application Ser. No. 13/481,102, titled "Resistive Memory Devices and Related Methods," naming as first inventor Peter K. Naji, filed May 25, 2012 and issued Jul. 8, 2014 as U.S. Pat. No. 8,773,887 (hereinafter the '887 patent), which claims the benefit of the filing date of U.S. Provisional App. No. 61/519,557, titled "Memory Architecture for Resistance-Based Memories," naming as first inventor Peter K. Naji, filed May 25, 2011, the disclosure of each of which is hereby incorporated entirely herein by reference.

BACKGROUND

1. Technical Field

Aspects of this document relate generally to computing device memories, such as Random Access Memories (RAMS), and to Digital-to-Analog Converters (DACs). Aspects of this document relate to Random Access Memory Digital-to-Analog Converters (RAMDACs). Aspects of this document relate to Non-Volatile Digital-to-Analog Converters (NVDACs) utilizing Electrically Programmable (EP), Electrically Erasable Programmble (EEP), flash, and/or resistance-based non-volatile memory elements.

2. Background Art

Digital-to-analog converters are used in a variety of computing devices to convert data. In implementations of display technology, for example, a Random Access Memory Digital-to-Analog Converter (RAMDAC) is formed using an integrated circuit (IC) and converts one or more digital values stored in memory into one or more analog signals to be used by a display. Some such implementations combine a static RAM (SRAM) including a color table with three digital-to-analog converters which change digital image data into analog signals that are sent to the display's color generators, one for each primary color: red, green, and blue. In cathode ray tube (CRT) displays an analog signal could be sent to each of three electron guns, and with displays using other technologies the signals may be sent to corresponding elements. The SRAM portion of a RAMDAC used in display technologies includes a color palette table. A logical color number in the digital data input to the SRAM is used to generate three separate values obtained from the table—one for each of red, green, and blue—that are output to one of three digital-to-analog converters. The analog signal output from the converter may then be input directly to the display electron guns or other image projecting mechanisms. The example of a RAMDAC is given, however, only as a non-limiting example of one area of digital-to-analog conversion technology.

SUMMARY

Embodiments of digital to analog converters and memory devices may include: a plurality of memory cells, each memory cell including a resistive memory element programmable between a high resistance state and a low resistance state; a binarizer electrically coupled to the plurality of memory cells and configured to receive memory cell outputs from the plurality of memory cells, each memory cell output corresponding with one of the memory cells, the binarizer further configured to generate binary weighted memory cell outputs; wherein the binary weighted memory cell outputs include each of at least a first subset of the memory cell outputs multiplied by one of a plurality of distinct multipliers; a summer electrically coupled to the binarizer and configured to sum the binary weighted memory cell outputs into an analog current signal, and; a current to voltage converter coupled with the summer and configured to convert the analog current signal to an analog voltage signal.

Embodiments of digital to analog converters and memory devices may include one or more or all of the following:

Each of the distinct multipliers may be a base of 2 raised to a whole number exponent distinct from the whole number exponent of every other distinct multiplier.

All of the memory cell outputs may be converted to binary weighted memory cell outputs by the binarizer.

The binarizer may be further configured to generate unary weighted memory cell outputs, wherein the unary weighted memory cell outputs include each of a second subset of the memory cell outputs multiplied by an identical multiplier, and wherein the summer is configured to sum the binary weighted memory cell outputs and the unary weighted memory cell outputs into the analog current signal.

The identical multiplier may be a base of 2 raised to a whole number exponent.

The plurality of memory cells may form bit lines, and the device may further include a first plurality of switches configured to couple a first subset of the bit lines with a plurality of voltage sources and a second plurality of switches configured to couple a second subset of the bit lines with the plurality of voltage sources.

The plurality of memory cells may form bit lines, and the device may further include a first plurality of switches configured to couple a first subset of the bit lines with a plurality of voltage sources and a second plurality of switches configured to couple a second subset of the bit lines with the plurality of voltage sources.

A decoder may be electrically coupled to a plurality of word lines of the plurality of memory cells, the decoder configured to decode an address input to select one of the word lines of the plurality of memory cells.

The binarizer may include at least one voltage clamping transistor and at least one pair of load transistors, wherein the at least one pair of load transistors is configured to weight, through a current mirror (current conveyor) configured to copy and multiply currents, a current corresponding with at least one of the memory cells.

The analog voltage signal may correspond with data stored on a word line of the plurality of memory cells.

Each resistive memory element may include a resistive device electrically coupled to an isolation transistor.

None of the memory cells may include an isolation switch.

Each of the plurality of memory cells may be physically identical.

Embodiments of digital to analog converters and memory devices may include: a plurality of memory cells, each memory cell including a resistive memory element programmable between a high resistance state and a low resistance state, wherein the plurality of memory cells is segmented into a unary (thermometer) coded segment and a binary coded segment; a summer electrically coupled with the plurality of memory cells and configured to sum memory cell outputs from the plurality of memory cells into an analog current signal, and; a current to voltage converter coupled with the summer and configured to convert the analog current signal to an analog voltage signal.

Embodiments of digital to analog converters and memory devices may include one or more or all of the following:

A binarizer may be electrically coupled to the plurality of memory cells and configured to receive the memory cell outputs from the plurality of memory cells, each memory cell output corresponding with one of the memory cells; the binarizer further configured to generate a plurality of binary weighted memory cell outputs, each binary weighted memory cell output including one of the memory cell outputs from one of the memory cells of the binary coded segment that is multiplied by one of a plurality of distinct multipliers; the binarizer further configured to generate a plurality of unary weighted memory cell outputs, each unary weighted memory cell output including one of the memory cell outputs from one of the memory cells of the unary coded segment that is multiplied by a multiplier identical to a multiplier of every other unary weighted memory cell (identical multiplier); and the summer may be configured to sum the unary weighted memory cell outputs and the binary weighted memory cell outputs into the analog current signal.

The plurality of memory cells may form bit lines, and the device may further include a first plurality of switches configured to couple a first subset of the bit lines with a plurality of voltage sources and a second plurality of switches configured to couple a second subset of the bit lines with the plurality of voltage sources.

The first plurality of switches and the second plurality of switches may have an inverse relationship such that when the first plurality of switches is open the second plurality of switches is closed and vice versa.

Embodiments of a method of using a digital to analog converter and memory device may include: providing a plurality of memory cells, each memory cell including a resistive memory element programmable between a high resistance state and a low resistance state, wherein the plurality of memory cells is segmented into a unary (thermometer) coded segment and a binary coded segment; summing memory cell outputs from the plurality of memory cells, with a summer electrically coupled with the plurality of memory cells, into an analog current signal, and; converting the analog current signal into an analog voltage signal using a current to voltage converter electrically coupled with the summer.

Embodiments of a method of using a digital to analog converter and memory device may include one or more or all of the following:

Receiving the memory cell outputs, from the plurality of memory cells, at a binarizer electrically coupled with the plurality of memory cells, each memory cell output corresponding with one of the memory cells; generating, using the binarizer, a plurality of binary weighted memory cell outputs, each binary weighted memory cell output including one of the memory cell outputs from one of the memory cells of the binary coded segment that is multiplied by one of a plurality of distinct multipliers; generating, using the binarizer, a plurality of unary weighted memory cell outputs, each unary weighted memory cell output including one of the memory cell outputs from one of the memory cells of the unary coded segment that is multiplied by a multiplier identical to a multiplier of every other unary weighted memory cell (identical multiplier), and; summing, using the summer, the unary weighted memory cell outputs and the binary weighted memory cell outputs into the analog current signal.

The plurality of memory cells may form bit lines, and the method may further include: coupling a first plurality of switches with the device so that the first plurality of switches is configured to couple a first subset of the bit lines with a plurality of voltage sources; coupling a second plurality of switches with the device so that the second plurality of switches is configured to couple a second subset of the bit lines with the plurality of voltage sources, wherein the first plurality of switches and the second plurality of switches include an inverse relationship such that when the first plurality of switches is open the second plurality of switches is closed and vice versa.

General details of the above-described embodiments, and other embodiments, is given below in the DESCRIPTION, the DRAWINGS, and in the CLAIMS.

BRIEF DESCRIPTION OF THE DRAWINGS

Embodiments will be discussed hereafter using reference to the included drawings, briefly described below, wherein like designations refer to like elements:

FIG. 4e is a plurality of tables of segmented (unary-binary) MNVDAC sequential and random code maps;

FIG. 5b is a plurality of tables of binary MNVDAC sequential and random code maps;

DESCRIPTION

Implementations/embodiments disclosed herein (including those not expressly discussed in detail) are not limited to the particular components or procedures described herein. Additional or alternative components, assembly procedures, and/or methods of use consistent with the intended digital to analog converters and memory devices and related methods may be utilized in any implementation. This may include any materials, components, sub-components, methods, sub-methods, steps, and so forth.

Figure 1A:
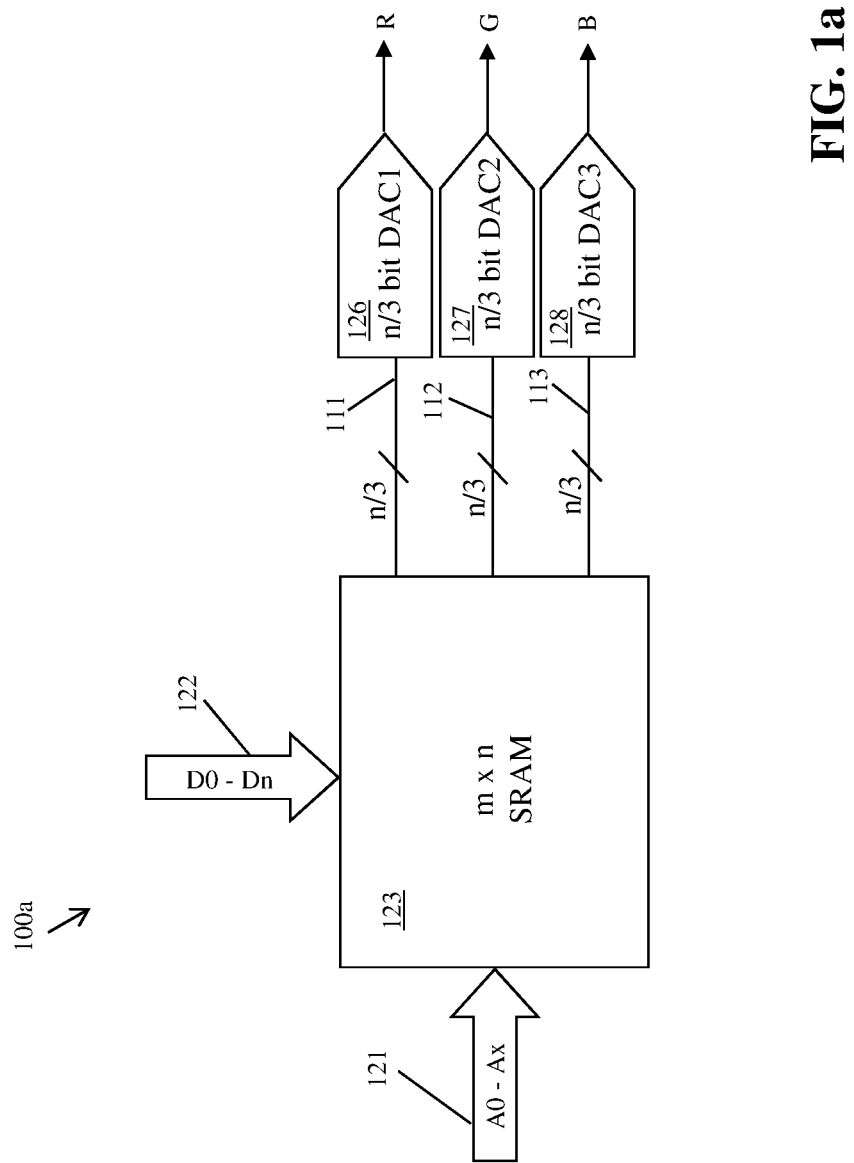
FIG. 1a is a simplified block diagram of a conventional RAMDAC used for image display.

Referring now to FIG. 1*a*, a diagram is given of a conventional RAMDAC 120 used in various old and new display technologies with one SRAM 123 coupled with three high speed DACs 126, 127, and 128, respectively. SRAM 123 is an 'n' bit wide memory comprising 'm' rows and 'n' columns or bit lines receiving address inputs A0 to Ax and data inputs D0 to Dn. Each DAC 126, 127, and 128 receives one third of SRAM 123 word length or n/3 through wire bus connections 111, 112, and 113 to generate output red (R), green (G), and blue (B), respectively.

Liquid Crystal Displays (LCDs) are sometimes desired to be used while wearing night vision goggles or with other low light imaging systems. The users of night vision goggles may desire to operate in stealth mode where minimum visible light and/or infra-red light is emitted by equipment. In order to enhance flexibility, some devices benefit from having an LCD that has two modes to allow the device/LCD to be used either with or without night vision goggles. These devices may present some design challenges, some of which are described in U.S. Pat. Pub. No. 2007/0279368 A1, published Dec. 6, 2007, listing as first inventor Aaron P. Shefter (hereafter the '368 publication). To overcome some of these challenges the '368 publication discloses using a programmable RAMDAC as a component of an LCD driver system to reduce light levels emitted by the LCD display system. The RAMDAC palette is reprogrammed to reduce the intensity of all input color values and enhance the display's contrast. This process of programming of the video controller's RAMDAC palette to reduce brightness and enhance the contrast of the display is referred to as 'RAMDAC Dimming'. The concept of 'RAMDAC Dimming' helps reduce the emitted display illumination to levels suitable for use with night vision goggles.

Figure 1B:
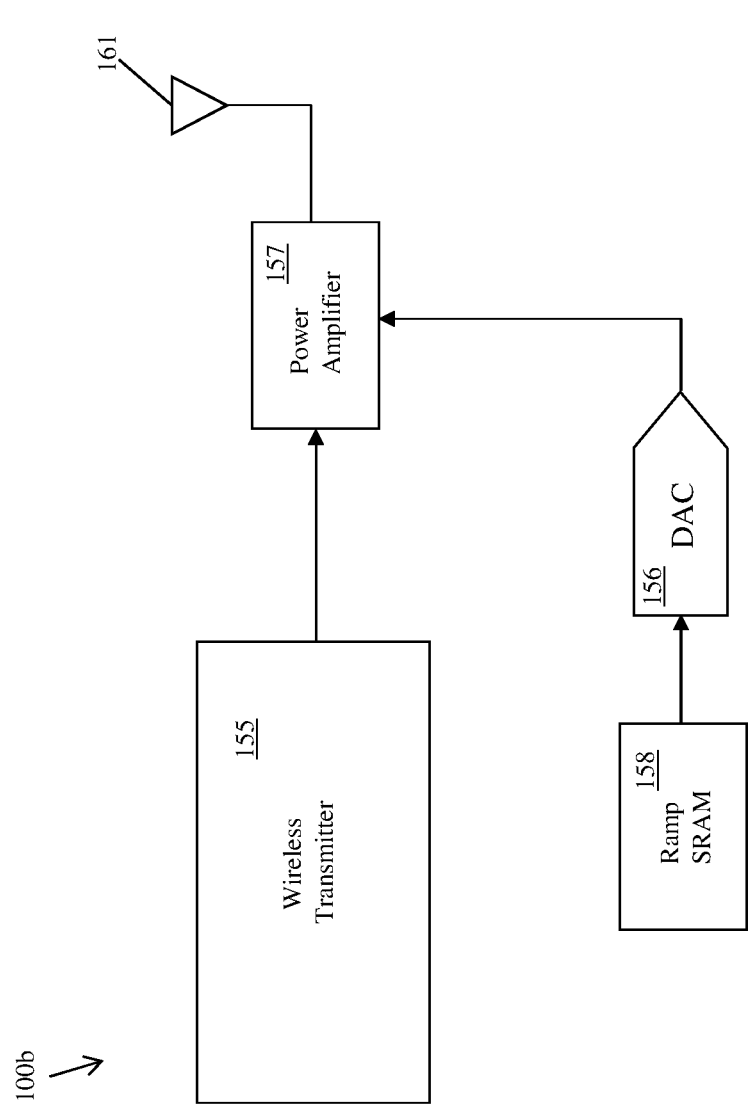
FIG. 1b is a simplified block diagram of a conventional RAMDAC used in a mobile wireless transmitter with a transmit power controller.

FIG. 1*b* illustrates a conventional use of a RAMDAC in a wireless transmitter such as those used in Global System for Mobile Communications/General Packet Radio Service (GSM/GPRS) compliant handsets. There exists a method for access burst and normal burst mix-mode support for GSM/GPRS handsets. Aspects of this method include transmitting bursts of different data types within a single GSM device, and the data types may include access burst data type and normal burst data type.

Transmit power may be ramped up prior to transmitting a first burst in the GSM frame for the single GSM device. A plurality of ramp-up values may be stored for use in ramping up the transmit power and these values may be converted to an analog control signal that may be used to control the ramping up transmit power. Similarly, transmit power may be ramped down after transmitting a last burst in the GSM frame for the single GSM device. A plurality of ramp-down values may be stored for use in ramping down the transmit power. The plurality of ramp-down values may be converted to an analog control signal that may be used to control the ramping down transmit power. Data that is to be transmitted may be stored in memory, and the data may be transmitted within a single GSM frame by the single GSM device. A portion of the stored data may be selected for an initialization portion of the burst and another portion may be selected for a data portion of the same burst.

FIG. 1*b* is a simplified block diagram of an exemplary transmission path for a GSM or any wireless transmit system with transmit power controller. Referring to FIG. 1*b*, there is shown wireless transmitter 155, power amplifier 157, antenna 161, ramp SRAM 158, and digital to analog converter (DAC) 156. Output of wireless transmitter 155 is coupled to input of power amplifier 157. Output of power amplifier 157 is coupled to antenna 161. Output of ramp SRAM 158 is coupled to the input of DAC 156. Output of DAC 156 is coupled to the control input of power amplifier 157.

For convenience of illustration details of wireless transmitter 155 are not shown, which details and methods of operation may be highly technology dependent. Wireless transmitter 155 may include one or more buffers, memories, multiplexers, switches, modulators, interpolators, DACs (in addition to DAC 156), control logic, event generators, finite state machines, and so forth.

Ramp SRAM 158 may include suitable circuitry and/or logic that may be adapted to store data. For example, a processor not shown in FIG. 1*b* may store data in ramp SRAM 158 that may be used to ramp up and ramp down a power level of the power amplifier 157.

DAC 156 may include suitable circuitry and/or logic that may be adapted to convert a digital signal to an analog signal. The DAC 156 may receive digital data from ramp SRAM 158 and convert the digital data to an analog signal that may control the gain of the power amplifier 157.

The power amplifier 157 may include suitable circuitry and/or logic that may be adapted to amplify an input signal from wireless transmitter 155. The antenna 161 may receive an analog signal from power amplifier 157 and transmit it.

Figure 1C:
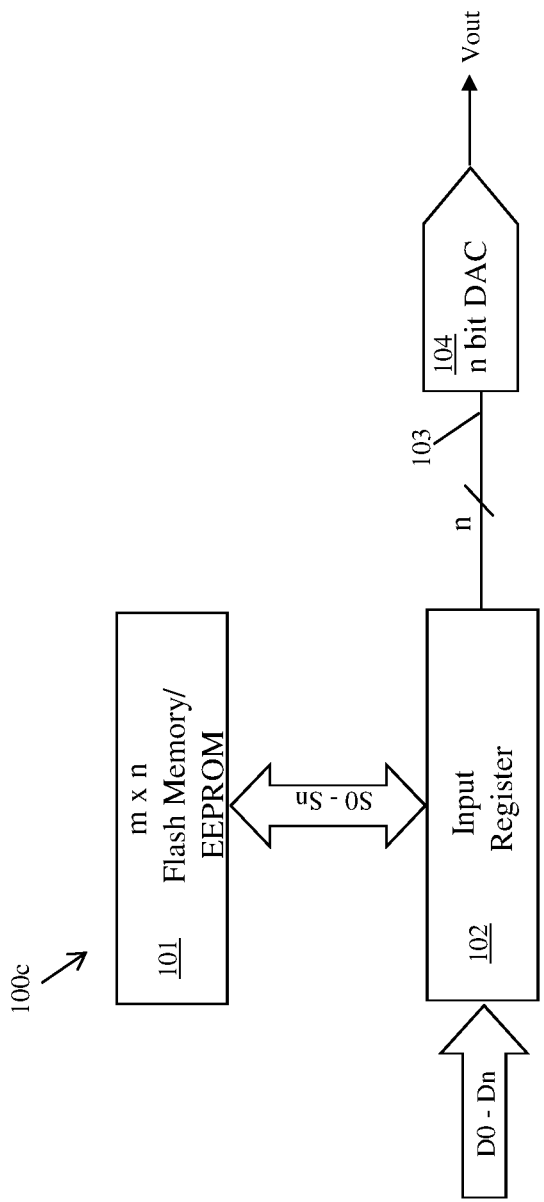
FIG. 1c is a simplified block diagram of a conventional non-volatile DAC (NVDAC)

FIG. 1*c* illustrates a conventional non-volatile DAC. DACs of this type are distributed by a number of component manufacturers and are ideal for applications in the consumer and industrial markets, such as wireless microphones, mp3-player accessories, motor control, flow measurement, temperature control, and light control. Integrated EEPROM or Flash memory enables DAC settings to be recalled at power up, for added system flexibility.

Systems such as the ones illustrated in FIGS. 1*a*-1*b* use an SRAM and a DAC to perform the RAMDAC function, and systems similar to the one in FIG. 1*c* use EEPROM or Flash memory, an input register, and a DAC to accomplish capabilities expected from a non-volatile DAC. Placement of an SRAM, a DAC, and an interconnect between the SRAM and DAC can require large areas on a semiconductor die/wafer. Furthermore, an SRAM and a DAC can consume large amounts of power due to required current drain, and can introduce additional system delays due to required subsystem timing and propagation delay through the interconnect and routing between the SRAM and DAC. Additionally, large amounts of engineering development time and two different areas of expertise have to be devoted to hardware and software development using an SRAM and a DAC.

A similar observation can be made of FIG. 1*c*, where an EEPROM or Flash memory is placed in the proximity of a DAC along with DAC register logic. A separate EEPROM/Flash memory, DAC, and DAC registers adds significant complexity to the system, and consumes large amounts of area and power. Furthermore, large amounts of engineering development time and two different areas of expertise have to be devoted to hardware and software development of an EEPROM/Flash memory and a DAC.

Implementations of RAMDACs and NVDACs disclosed herein provide improved architecture which overcome, among other things, issues described above with the above-described conventional designs. The implementations disclosed herein drastically reduce the area, power consumption, and system complexity of static RAM (SRAM) and digital to analog converter (DAC) combination systems, and EEPROM/flash memory and DAC combination systems. Such changes provide for substantial improvement for all wireless and mobile systems and devices such as handsets, smart phones, personal digital assistants (PDAs), and tablets where size and battery life are important. The implementations disclosed herein will also be beneficial to systems such as flat panel displays (FPDs) used in military and other applications.

Implementations of non-volatile DACs disclosed herein do not require a separate Flash or EEPROM memory and a separate DAC. This will be a substantial improvement to these popular systems used in consumer and industrial markets.

Implementations of memory devices disclosed herein utilize a Resistive Memory Element (RME) such as, by non-limiting example, one or more RMEs described in the above-mentioned '887 patent, and other non-volatile and volatile memory elements or circuits known as memory cells.

The architecture of a Resistive Random-Access-Memory (RRAM) such as a Magnetoresistive Random Access Memory (MRAM) or Conductive Bridging Random Access Memory (CBRAM) generally includes a plurality or array of memory cells and a plurality of word/digit line and bit line intersections. The resistance-based memory cell used is a resistive element such as, by non-limiting example, a magnetic tunnel junction (MTJ), an isolation transistor, and intersection of digit/word and bit lines. The isolation transistor is generally an N-channel field effect transistor (FET). An interconnect stack connects the isolation transistor to the MTJ or other resistive element device. A different stack connects the resistive element device to the bit line. The digit/word line is used to control the isolation transistor and/or to create and/or transmit the signal (or part of the signal) used to program the resistance-based memory element.

Resistive memory elements can be based in various technologies such as Field Induced Switching Magnetoresistive Random Access Memories (FIS-MRAMs), Spin Transfer Torque MRAMs (STT-MRAMs), Giant Magneto Resistivity MRAMs (GMR-MRAMs), Phase-Change RAMs (PCRAMs), and Metallization or Conductive Bridging RAMs (CBRAMs). Other classes of resistive non-volatile memory cells include, among others, Electrically Erasable Programmable Read Only Memory (EEPROM) and Flash memory.

As is understood by those skilled in the art, a resistive memory element has relatively high resistance in one state of programming and a relatively low resistance in the other. For example, an MTJ element has a relatively high resistance when the free and pinned magnetic vectors are misaligned and a relatively low resistance when they are aligned. Similarly, a Flash memory cell has a high resistance when programmed and a low resistance when erased. Regardless of various methods of programming used by memory elements in different technologies, all resistive memory cells are read by forcing a voltage and measuring current or forcing a current and measuring voltage. In both cases a current flows through both the resistive memory element and its isolation or control device.

In implementations of memory devices disclosed herein an SRAM or RAM device and a DAC are merged into one new device, which is now non-volatile. Similarly, non-volatile memory such as Flash and a DAC are merged into one device, which has retained its non-volatile status. This new device is hereafter named Merged Non-Volatile DAC (MNVDAC). This new device includes a plurality of memory cells arranged in rows and columns, each memory cell being a resistive switching memory element and an isolation or control device. A write circuit not discussed in detail herein places selected resistive memory elements in a high resistance state or low resistance state depending on information input into the memory. The specific write circuit and method may be highly technology dependent and may be chosen by the practitioner of ordinary skill in the art depending on the end use. Once digital data is stored in an MNVDAC memory array, the digital code stored in the resistive memory elements is converted to an analog value by exercising the desired group of memory cells simultaneously—this is known as 'conversion'. The DAC systems and methods disclosed herein can be applied to MNVDACs regardless of write methodology and technology. Furthermore, the DAC systems and methodologies disclosed herein can be applied to MNVDACS which use a plurality of memory cells that omit the isolation device.

The MNVDAC device performs the data storage and digital to analog conversion in the same device, and possibly simultaneously in the same clock cycle in some MNVDAC architectures described in embodiments herein. Furthermore, simultaneous data storage and conversion is possible through technologies such as FIS-MRAM. The MNVDAC device includes a bit line voltage clamp, a binary weighted current multiplier or binarizer, an analog current summer, and a current to voltage converter. Alternatively, the MNVDAC device includes a bit line voltage clamp, a segmented current multiplier consisting of thermometer coded and binary weighted multiplier or binarizer, an analog current summer, and a current to voltage converter. The MNVDAC provides a method of converting the digital data stored in a group of memory elements to an analog value, the method including: a decoded input address selects a word line and multiple columns or bit lines; selected bit lines are clamped to a desired voltage and the resulting bit line currents are binarily weighted, and the weighted bit lines are summed to one total value by a summer and directed into the input of a current to voltage converter. Binary weighting is accomplished utilizing current multipliers. Alternatively, the MNVDAC provides a method of converting the digital data stored in a group of memory elements to an analog value, the method including: a decoded input address selects a word line and multiple columns or bit lines; selected bit lines are clamped to a desired voltage and the resulting bit line currents are segmented into thermometer and binary weighting, and the weighted currents are summed to one total value by a summer and directed into the input of a current to voltage converter. Segmentation will yield a higher resolution and linearity.

Implementations of memory devices disclosed herein provide a method whereby the effective signal of a memory element is multiplied by any desired factor and hence increasing Dynamic Range (DR) and signal-to-noise ratio (SNR) of the MNVDAC. The multiplication will be limited by voltage supply and maximum acceptable current drain.

Figure 2A:
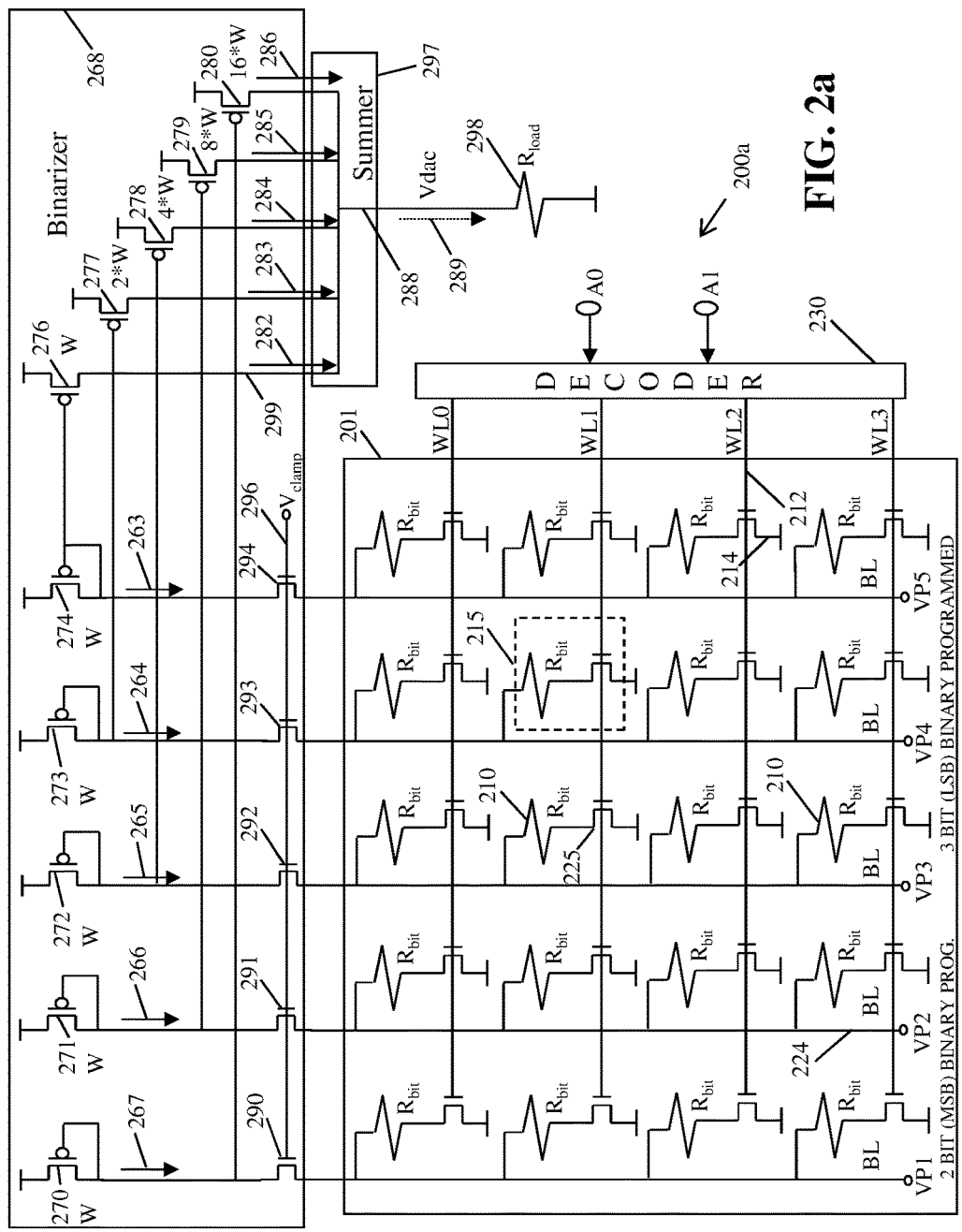
FIG. 2a is a simplified diagram of an implementation of a binary MNVDAC.

Referring now to FIG. 2a, a simplified block diagram is illustrated of a resistance-based MNVDAC 200a. MNVDAC 200a includes a plurality of memory cells 215 arranged in rows and columns. MNVDAC 200a is defined as Merged Non-Volatile Digital to Analog Converter, where individual memory elements 210 can be any type of resistive memory element (RME). For convenience of illustration, while it will be understood that a smaller or larger array could be used if desired, in this example memory array 201 includes a 4×5 array of resistive memory cells 215 arranged in four rows and five columns.

Memory cell 215 includes a resistive memory element (RME), electrically represented as a resistor 210 coupled to an isolation transistor 225. In implementations the RME may be a spin-transfer torque magneto-resistive random access memory (STT-MRAM) element or a FLASH cell in memory array 201. Generally, the information stored in memory cell 215 is interrogated by supplying a conversion current to one end of resistors 210, $R_{bit}$ and by grounding the source 214 of isolation or control transistor 225. A word line 212 connects to the gate terminal of each isolation or control transistor 225 in a row of memory cells 215. A decoder 230 couples to word lines 212 and decodes address input A0 and A1 to select one of word lines 212. Memory array 201 includes a plurality of bit lines 224 coupled to binarizer 268, and outputs 299 of binarizer 268 are coupled to summer 297. The single output of summer 297 is coupled to current to voltage converter 298, which generates analog output voltage. In addition, bit lines 224 are coupled to voltage or current source terminals VP1 through VP5. During loading of DAC codes into MNVDAC Voltage clamp transistors 290-294 are placed in cut-off state thereby isolating MNVDAC memory array 201 from binarizer 268. Subsequently, decoder 230 sequentially enables word lines 212, and for each enabled word line, VP1 through VP5 are supplied with a positive voltage or current representing a DAC bit of logical 1(0), or negative voltage or negative current representing a DAC bit of logical 0(1).

The conversion path MNVDAC 200a includes a binarizer 268 comprising voltage clamping transistors 290 through 294, and load transistors 271 through 274. In implementations the load transistors 270 through 274 may be diode connected PMOS load transistors. Diode connected transistors have a gate that is coupled to their drain. Load transistors 270 and 280 form a current copier and multiplier configuration commonly known in the art as current mirror or conveyor. Load transistor 271, 272, 273, and 274 form the same current mirror configuration with transistors 279, 278, 277, and 276, respectively. Load transistors 270, 271, 272, 273, and 274 are coupled to clamp transistors 290, 291, 292, 293, and 294, respectively. Voltage clamp transistors 290 through 294 are coupled to a control terminal 296 that is biased with a clamp voltage $V_{clamp}$. The clamp transistors 290 through 294 are coupled to bit lines 224, which are in turn coupled to isolation transistors 225 via the resistive memory elements 210 of the corresponding memory cells 215. The resistive memory elements (RMEs) 210 may each include a magnetic tunnel junction (MTJ) illustrated as a resistance Rbit, which includes a logic "0" or logic "1" resistance value. The isolation transistors 225 are coupled to ground. The gate of each isolation transistor is coupled to one of the plurality of word lines 212. In the embodiment shown in FIG. 2a the isolation transistors are NMOS transistors.

MNVDAC 200a operates in current mode, where voltage is forced and current is measured. The current mode of read operation offers high speed and bandwidth and substantial area savings. In other implementations a voltage mode of read operation could be utilized. In current mode of read operation, binarizer 268 in MNVDAC 200a, includes a voltage clamping feature, where clamp transistors 290 through 294 clamp the bit lines 224 to $V_{clamp}$-$V_{tn}$, where $V_{tn}$ is threshold voltage of NMOS clamp transistors 290 through 294, and $V_{clamp}$ is a selected bias voltage. The $V_{clamp}$-$V_{tn}$ is referred to as bit line 224 bias voltage (hereafter Vb). Clamping forces the bit lines 224 to a constant bias voltage (ignoring random $V_{tn}$ variations) thereby virtually eliminating voltage swings on bit lines 224. Load transistors 270, 271, 272, 273, and 274 in binarizer 268 are coupled to clamp transistors 290, 291, 292, 293, and 294 to generate each data signal. Each data signal is represented as one of current values 263 (I0), 264 (I1), 265 (I2), 266 (I3), and 267 (I4). Currents I0, I1, I2, I3 and I4 are binarized while flowing through binarizer 268 generating binary weighted currents 282 (Ib0), 283 (Ib1), 284 (Ib2), 285 (Ib3) and 286 (Ib4), where the I0, Ib0 pair are the least-significant-bit (LSB) pair, and the I4, Ib4 pair are the most-significant-bit (MSB) pair. Currents Ib0, Ib1, Ib2, Ib3 and Ib4 are summed via summer 297 represented in FIG. 2 as 289 (Iout) into node 288. Summer 297 in MNVDAC 200a is a simple wire sum based on Kirchoff's current law, which is coupled to current to voltage converter 298.

In MNVDAC 200a, a resistance Rbit of the resistive memory element 210 can be either set to a logical "0" state, resulting in a low resistance setting, R, or set to a logical "1" state, resulting in a high resistance setting, R+ΔR. Therefore, Rbit can be stated as $$R_{bit} = R + \Delta R * d_{n'}$$

where n' is a non-negative integer. In a logical "0" state Rbit=R, since $d_{n'}$=0, and in a logical "1" state Rbit=R+ΔR, since $d_{n'}$=1. Consequently, currents I4, I3, I2, I1, and I0 are stated as $$I_4 = \frac{V_{clamp} - V_{tn}}{R + \Delta R * d_4} = \frac{V_b}{R + \Delta R * d_4}$$

$$I_3 = \frac{V_{clamp} - V_{tn}}{R + \Delta R * d_3} = \frac{V_b}{R + \Delta R * d_3}$$

$$I_2 = \frac{V_{clamp} - V_{tn}}{R + \Delta R * d_2} = \frac{V_b}{R + \Delta R * d_2}$$

$$I_1 = \frac{V_{clamp} - V_{tn}}{R + \Delta R * d_1} = \frac{V_b}{R + \Delta R * d_1}$$

$$I_0 = \frac{V_{clamp} - V_{tn}}{R + \Delta R * d_0} = \frac{V_b}{R + \Delta R * d_0}$$

Above listed equations for currents I0, I1, I2, I3, and I4 demonstrate that they are a function of input digital code or data written into five RMEs coupled to one word line. Subsequently, currents I0, I1, I2, I3, and I4 are further processed in binarizer 268, where they are binarily weighted in a manner that corresponds to the significance of that bit in the digital input data, which was written into five RMEs during an earlier program cycle. That is, I0 (the LSB) as a function of d0 gets multiplied by $2^0$, i.e., one unit of current, I1 as a function of d1 gets multiplied by $2^1$, i.e., two units of current, I2 as a function of d2 gets multiplied by $2^2$, i.e., four units of current, I3 (the MSB-1) as a function of d3 gets multiplied by $2^3$, i.e., eight units of current, and I4 (the MSB) as a function of d4 gets multiplied by $2^4$, i.e., sixteen units of current. Furthermore, currents I0, I1, I2, I3 and I4 can be amplified in addition to receiving binary weights. This translates into a base binarizer 268 gain, which increases effective RME signal and multiplies least-significant-bit (LSB) current by a factor m. As a result, outputs of the binarizer 268 are stated as $$I_{b4} = 16 * m * \frac{V_{clamp} - V_{tn}}{R + \Delta R * d_4} = 16 * m * \frac{V_b}{R + \Delta R * d_4}$$

$$I_{b3} = 8 * m * \frac{V_{clamp} - V_{tn}}{R + \Delta R * d_3} = 8 * m * \frac{V_b}{R + \Delta R * d_3}$$

$$I_{b2} = 4 * m * \frac{V_{clamp} - V_{tn}}{R + \Delta R * d_2} = 4 * m * \frac{V_b}{R + \Delta R * d_2}$$

$$I_{b1} = 2 * m * \frac{V_{clamp} - V_{tn}}{R + \Delta R * d_1} = 2 * m * \frac{V_b}{R + \Delta R * d_1}$$

$$I_{b0} = m * \frac{V_{clamp} - V_{tn}}{R + \Delta R * d_0} = m * \frac{V_b}{R + \Delta R * d_0}$$

In general, binarizer 268 output currents can be stated as $$I_{b_{n-1}} = 2^{n-1} * m * \frac{V_{clamp} - V_{tn}}{R + \Delta R * d_{n-1}} = 2^{n-1} * m * \frac{V_b}{R + \Delta R * d_{n-1}}$$

$$I_{b_{n-2}} = 2^{n-2} * m * \frac{V_{clamp} - V_{tn}}{R + \Delta R * d_{n-2}} = 2^{n-2} * m * \frac{V_b}{R + \Delta R * d_{n-2}}$$

$$I_{b_{n-3}} = 2^{n-3} * m * \frac{V_{clamp} - V_{tn}}{R + \Delta R * d_{n-3}} = 2^{n-3} * m * \frac{V_b}{R + \Delta R * d_{n-3}}$$

$$\vdots$$

where n is equal to number of bits that are converted, or RMEs which are binarized, and summed, and m is the binarizer 268 gain factor. For example, m=1 will result in gain of one with binary weights of 1, 2, 4, 8 and 16, whereas m=2 will result in binary weights of 2, 4, 8, 16, and 32. Gain factor m can be written as $m=2^k$, where k is an additional bit of resolution for MNVDAC 200a above and beyond the inherent n bits. At k=0, m=1, no additional resolution is achieved, and no change in signal-to-noise-ratio (SNR), but at k=1, m=2, one additional bit of resolution and a 6 db increase in SNR is achieved. Variable k can be any positive real number.

In binarizer 268 currents I0, I1, I2, I3, and I4 are binarily weighted and amplified via current mirrors formed by PMOS transistor pairs such as 270 and 280. Pairs 270 and 280 multiply current I4 by sixteen since the width W of PMOS transistor 280 is 16 times width W of PMOS transistor 270. Similarly, PMOS transistor pair 271 and 279 have a one to eight relationship, PMOS transistor pair 272 and 278 have a one to four width W ratio, PMOS transistor pair 273 and 277 have two to one width W ratio, and PMOS transistor pair 274 and 276 have one to one width W ratio.

MNVDAC 200a is a five bit DAC, which comprises five memory cells 215, five clamp transistors, five weighted current mirrors or conveyors, a five input summer, and a current to voltage converter. Therefore, the system and methodology of MNVDAC 200a is capable of converting five bits of stored digital data to an analog value. It should be understood by those skilled in the art that a higher or lower number of stored bits of data can be converted through simple modifications. For example, an eight bit DAC with an eight bit conversion path can be implemented if the conversion path comprises eight memory cells 215, eight clamp transistors, eight weighted current mirrors or conveyors, an eight input summer, and a current to voltage converter. The number of bits may of course be ramped up or down in a similar fashion as desired, to any desired number of bits, for any particular end use.

Figure 2B:
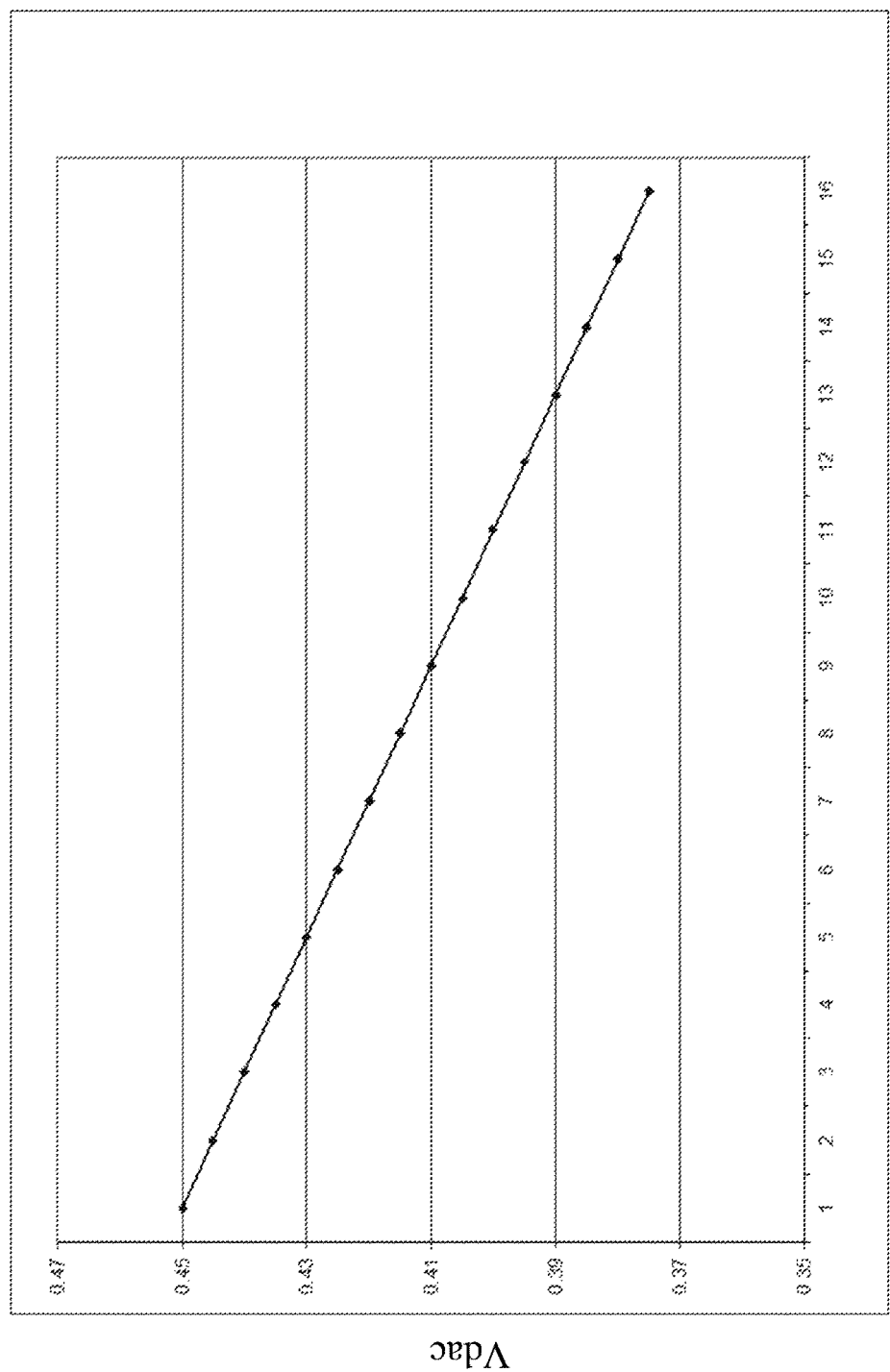
FIG. 2b is a graph plotting a binary MNVDAC conversion curve.

FIG. 2b is a plot of voltage Vdac at the output of MNVDAC 200a. It displays the linearity and monotonicity of the DAC output, where the horizontal or x-axis represents input digital code, and the vertical or y-axis is output voltage Vdac.

Figure 3:
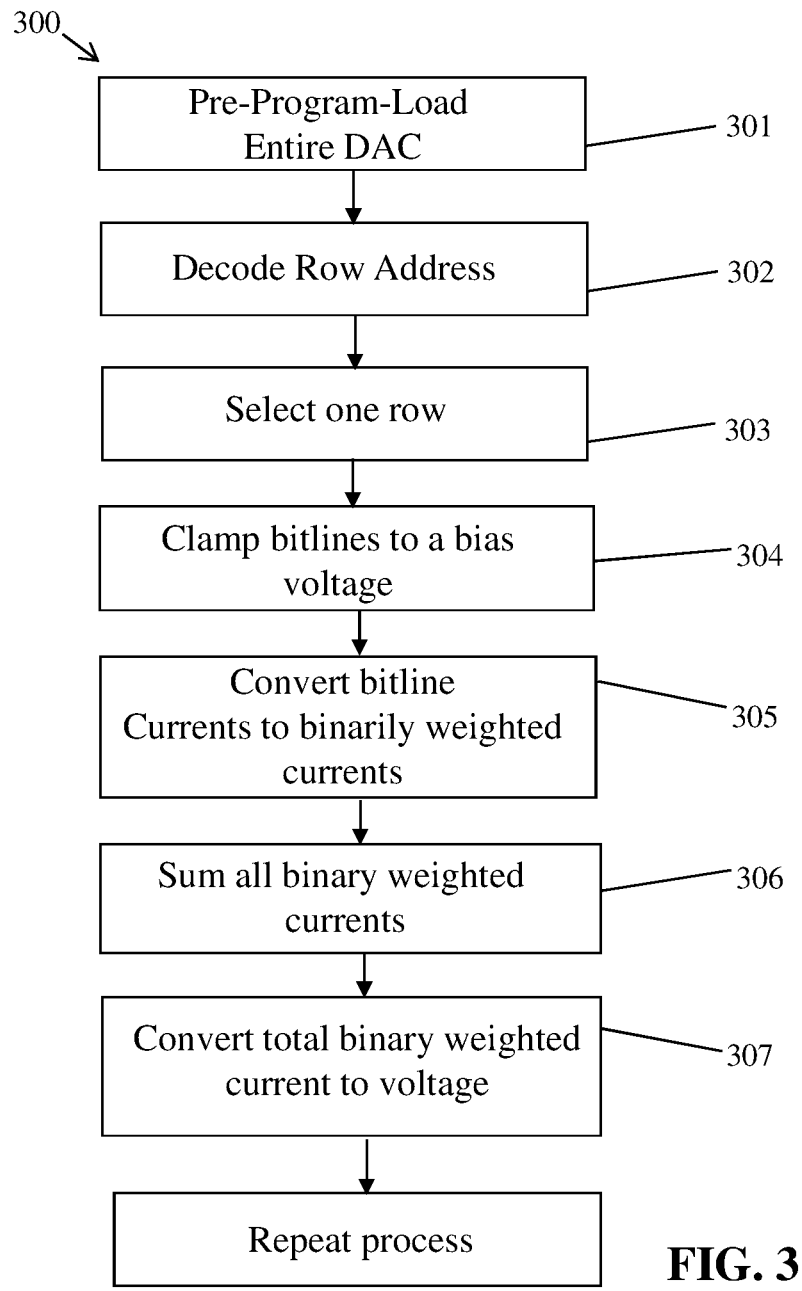
FIG. 3 is a flow chart of an implementation of a binary MNVDAC conversion process.

Referring to FIG. 3, flow diagram 300 of MNVDAC 200a is illustrated. At 301 the entire MNVDAC memory array is loaded with digital data by programming or erasing the individual memory cells. Row address is decoded in 302, and at 303 one row is selected. For example, in MNVDAC 200a in FIG. 2a, one word line 212 is selected and five columns are activated. There is no column selection in MNVDAC 200a, since it is a five bit DAC and has a 4×5 memory array.

Continuing to 304, a control voltage is applied to clamp transistors 290 through 294 coupled to bit lines 224 to set individual bit line bias voltages such that bit line voltage swings are eliminated. Clamping of bit lines is a requirement for current mode conversion, and current mode of conversion results in a high-speed conversion path, and considerably less semiconductor area relative to voltage mode conversion.

Moving to 305, selected bit line currents of a DAC memory array are assigned a weight such that the bit line current ratios are exactly a factor of two, in which case the bit lines are binarily weighted. For example, in MNVDAC 200a in FIG. 2a weights of bit line currents I4, I3, I2, I1, and I0 are $2^4$, $2^3$, $2^2$, $2^1$, and $2^0$, respectively.

Advancing to 306, the binary weighted bit line currents are summed. In FIG. 2a binary weighted currents IB4, Ib3, Ib1, Ib2, and Ib0 are linearly combined to generate output current 289.

Finally, at 307, the sum of all binary weighted currents is converted to an analog voltage. Flow diagram 300 is repeated continuously to maintain typical digital-to-analog conversion (DAC) operation.

Figure 4A:
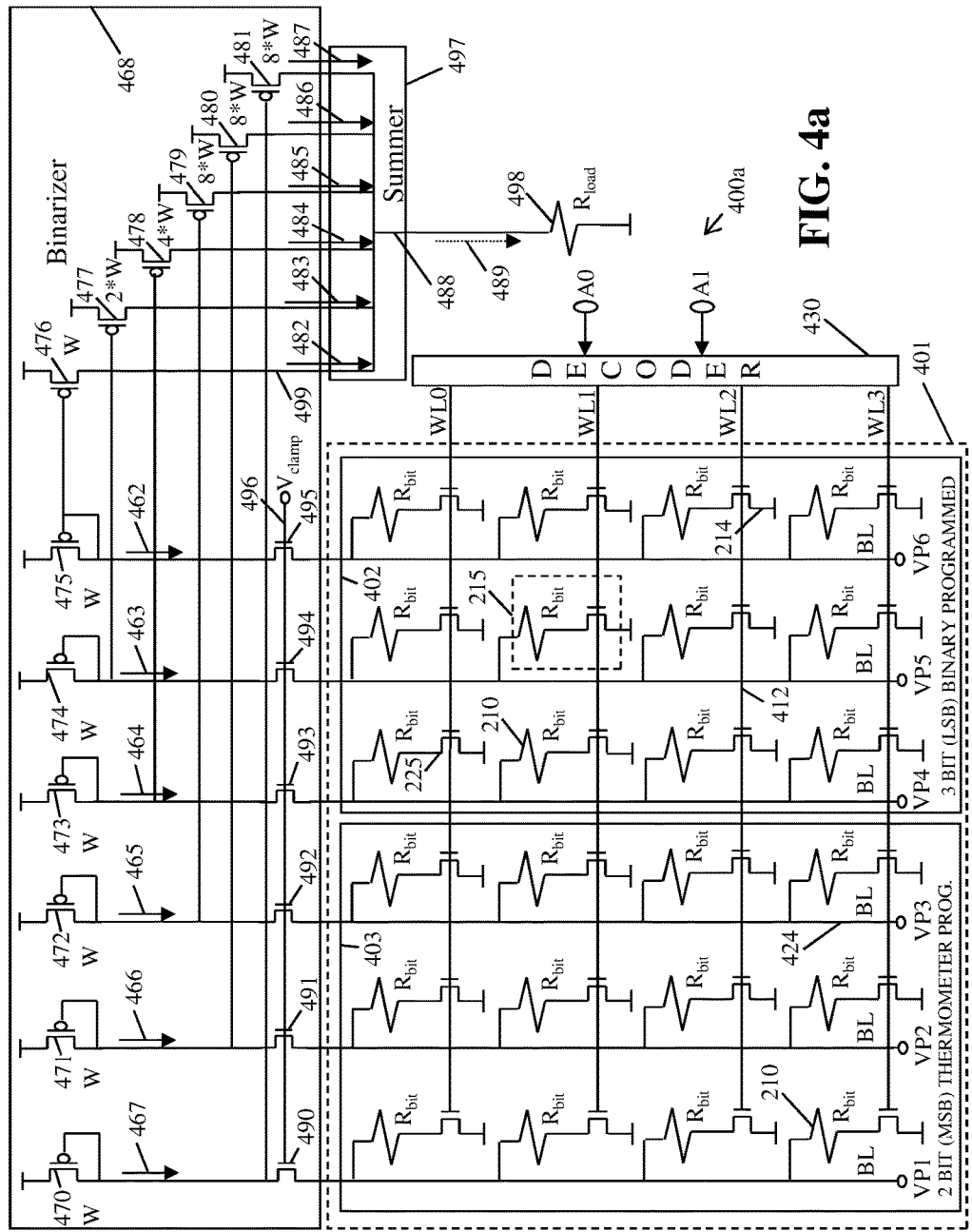
FIG. 4a is a simplified diagram of an implementation of a segmented (unary-binary) MNVDAC.

FIG. 4a illustrates another embodiment of an MNVDAC. This version differs from MNVDAC 200a in that MNVDAC 400a possesses a segmented architecture, where the memory array and the binarizer are segmented. A segmented MNVDAC architecture combines a thermometer coded memory array with a binary coded memory array and a binarizer. The term binarizer is still maintained in this embodiment even though the binarizer is segmented and not purely binary-weighted.

In an n bit segmented MNVDAC, the first m MSB bits of n bit input digital code is converted with a thermometer coded memory array and a unary weighted binarizer, and the other n-m (n minus m) LSB bits are converted with a binary-coded memory array and a binary weighted binarizer. The thermometer coded memory array has $2^m-1$ columns, and the binary-coded memory array has n-m columns. Both memory arrays utilize the same rows, and the number of rows are not subject to segmentation. The thermometer portion of the binarizer receives a uniform weight of $2^{n-m}$, and the binary-weighted portion of the binarizer receives decreasing binary weights beginning with $2^{n-m-1}$.

A high-resolution binary-weighted MNVDAC may suffer from transient glitches, which may affect the accuracy of the DAC conversion during operation (especially at mid-code transitions). For example, at the half-scale transition when the most significant bit (MSB) is turned on (or off) and all the other bits are turned off (or on), a glitch with maximum amplitude will occur. This characteristic of binary-weighted MNVDAC makes it inapplicable to high-resolution conversion, and it is not guaranteed to be monotonic.

To solve the transient glitch, an entirely thermometer code MNVDAC can be adopted, where $2^n-1$ memory cells, columns, clamp devices, weighted current mirrors or conveyors would be required. Therefore, an entirely thermometer MNVDAC requires a larger memory array and binarizer, which results in a larger amount of die area. The segmented architecture of MNVDAC 400a provides a tradeoff between chip area and output signal quality.

FIG. 4a is a simplified block diagram of a segmented MNVDAC 400a which includes a plurality of memory cells 215 arranged in rows and columns. Individual memory elements 210 can be any type of resistive memory element (RME). For convenience of illustration, while it will be understood that a smaller or larger array could be used if desired, in this example memory array 401 includes a 4×6 array of resistive memory cells 215 arranged in four rows and six columns. Memory array 401 consists of a unary (or thermometer) array 403, and a binary array 402.

Memory cell 215 includes a resistive memory element (RME), electrically represented as a resistor 210 coupled to an isolation transistor 225. In implementations the RME may be a spin-transfer torque magneto-resistive random access memory (STT-MRAM) element or a FLASH cell in memory array 401. Generally, the information stored in memory cell 215 is interrogated by supplying a conversion current to one end of resistors 210, $R_{bit}$ and by grounding the source 214 of isolation or control transistor 225. A word line 412 connects to the gate terminal of each isolation or control transistor 225 in a row of memory cells 215. A decoder 430 couples to word lines 412 and decodes address input A0 and A1 to select one of word lines 412. Memory array 401 includes a plurality of bit lines 424 coupled to binarizer 468, and outputs 499 of binarizer 468 are coupled to summer 497. The single output of summer 497 is coupled to current to voltage converter 498, which generates analog output voltage.

The conversion path MNVDAC 400a includes a binarizer 468 comprising voltage clamping transistors 490 through 495, and load transistors 470 through 475. In implementations the load transistors 470 through 475 may be diode connected PMOS load transistors. Diode connected transistors have a gate that is coupled to their drain. Load transistors 470 and 481 form a current copier and multiplier configuration commonly known in the art as current mirror or conveyor. Load transistors 471, 472, 473, 474 and 475 form the same current mirror configuration with transistors 480, 479, 478, 477, and 476, respectively. Load transistors 470, 471, 472, 473, 474 and 475 are coupled to clamp transistors 490, 491, 492, 493, 493, 494 and 495, respectively. Voltage clamp transistors 490 through 495 are coupled to a control terminal 496 that is biased with a clamp voltage $V_{clamp}$. The clamp transistors 490 through 495 are coupled to bit lines 424, which are in turn coupled to isolation transistors 225 via the resistive memory elements 210 of the corresponding memory cells 215. The resistive memory elements (RMEs) 210 may each include a magnetic tunnel junction (MTJ) illustrated as a resistance Rbit, which includes a logic "0" or logic "1" resistance value. The isolation transistors 225 are coupled to ground. The gate of each isolation transistor is coupled to one of the plurality of word lines 412. In the embodiment of FIG. 4a the isolation transistors are NMOS transistors.

MNVDAC 400a operates in current mode, where voltage is forced and current is measured. This offers high speed and bandwidth and substantial area savings. In other implementations a voltage mode of read operation could be utilized. In current mode of read operation, binarizer 468 in MNVDAC 400a includes a voltage clamping feature, where clamp transistors 490 through 495 clamp the bit lines 424 to $V_{clamp}$-$V_{tn}$, where $V_{tn}$ is threshold voltage of NMOS clamp transistors 490 through 495, and $V_{clamp}$ is a selected bias voltage. The $V_{clamp}$-$V_{tn}$ is referred to as bit line 424 bias voltage (hereafter Vb). Clamping forces the bit lines 424 to a constant bias voltage (ignoring random $V_{tn}$ variations) thereby virtually eliminating voltage swings on bit lines 424. Load transistors 470, 471, 472, 473, 474 and 475 in binarizer 468 are coupled to clamp transistors 490, 491, 492, 493, 493, 494 and 495 to generate each data signal. Each data signal is represented as one of current values 462 (I0), 463 (I1), 464 (I2), 465 (I3), 466 (I4), and 467 (I5). Currents I0, I1, I2, I3, I4 and I5 are binarized while flowing through binarizer 468 generating binary weighted currents 482 (Ib0), 483 (Ib1), 484 (Ib2), and unary weighted currents 485 (Iu0) 486 (Iu1), and 487 (Iu2), where the I0, Ib0 pair is the least-significant-bit (LSB) pair and the I5, Iu2 pair is the most-significant-bit (MSB) pair. Unary currents Iu0, Iu1, and Iu2 receive a unary weight of $2^{n-m}$ prior to summation. Currents Ib0, Ib1, Ib2, Iu0, Iu1 and Iu2 are summed via summer 497 represented in FIG. 4a as 489 (Iout) into node 488. Summer 497 in MNVDAC 400a is a simple wire sum based on Kirchoff's current law, which is coupled to current to voltage converter 498.

In MNVDAC 400a a resistance Rbit of the resistive memory element 210 can be either set to a logical "0" state, resulting in a low resistance setting, R, or can be set to a logical "1" state, resulting in a high resistance setting, R+ΔR. Therefore, Rbit can be stated as $R_{bit}=R+\Delta R*d_{n'}$ where n' is a non-negative integer. In a logical "0" state Rbit=R, since $d_{n'}=0$, and in a logical "1" state Rbit=R+ΔR, since $d_{n'}=1$. Consequently, currents I5, I4, I3, I2, I1, and I0 are stated as $$I_5 = \frac{V_{clamp} - V_{tn}}{R + \Delta R * d_5} = \frac{V_b}{R + \Delta R * d_5}$$

$$I_4 = \frac{V_{clamp} - V_{tn}}{R + \Delta R * d_4} = \frac{V_b}{R + \Delta R * d_4}$$

$$I_3 = \frac{V_{clamp} - V_{tn}}{R + \Delta R * d_3} = \frac{V_b}{R + \Delta R * d_3}$$

$$I_2 = \frac{V_{clamp} - V_{tn}}{R + \Delta R * d_2} = \frac{V_b}{R + \Delta R * d_2}$$

$$I_1 = \frac{V_{clamp} - V_{tn}}{R + \Delta R * d_1} = \frac{V_b}{R + \Delta R * d_1}$$

$$I_0 = \frac{V_{clamp} - V_{tn}}{R + \Delta R * d_0} = \frac{V_b}{R + \Delta R * d_0}$$

Above listed equations for currents I0, I1, I2, I3, I4 and I5 demonstrate that they are a function of input digital code or data written into six RMEs coupled to one word line. Subsequently, currents I0, I1, I2, I3, I4, and I5 are further processed in binarizer 468, where they are unarily and binarily weighted in a manner that corresponds to the significance of that bit in the digital input data, which was written into six RMEs during an earlier program cycle. That is, binary currents I0, I1, and I2 (the LSBs) as a function of d0, d1, and d2 get multiplied by $2^0$, $2^1$, and $2^2$ units of current, respectively. In addition, unary currents I3, I4, and I5 (the MSBs) as a function of d3, d4, and d5 get multiplied by $2^3$, $2^3$, and $2^3$ units of current, respectively. Furthermore, currents I0, I1, I2, I3, I4 and I5 can be amplified in addition to receiving binary and unary weights. This translates into a base binarizer 468 gain, which increases effective RME signal and multiplies least-significant-bit (LSB) current by a factor k. As a result, outputs of the binarizer 468 are stated as follows:

$$I_{u2} = 8*k*\frac{V_{clamp} - V_{tn}}{R + \Delta R * d_5} = 8*k*\frac{V_b}{R + \Delta R * d_5}$$

$$I_{u1} = 8*k*\frac{V_{clamp} - V_{tn}}{R + \Delta R * d_4} = 8*k*\frac{V_b}{R + \Delta R * d_4}$$

$$I_{u0} = 8*k*\frac{V_{clamp} - V_{tn}}{R + \Delta R * d_3} = 8*k*\frac{V_b}{R + \Delta R * d_3}$$

$$I_{b2} = 4*k*\frac{V_{clamp} - V_{tn}}{R + \Delta R * d_2} = 4*k*\frac{V_b}{R + \Delta R * d_2}$$

$$I_{b1} = 2*k*\frac{V_{clamp} - V_{tn}}{R + \Delta R * d_1} = 2*k*\frac{V_b}{R + \Delta R * d_1}$$

$$I_{b0} = k*\frac{V_{clamp} - V_{tn}}{R + \Delta R * d_0} = k*\frac{V_b}{R + \Delta R * d_0}$$

In general, binarizer 468 output currents can be stated as $$I_{u_{n-m-1}} =$$
$$2^{n-m}*k*\frac{V_{clamp} - V_{tn}}{R + \Delta R * d_{2^m-1+n-m-1}} = 2^{n-m}*k*\frac{V_b}{R + \Delta R * d_{2^m-1+n-m-1}}$$

$$I_{u_{n-m-2}} = 2^{n-m}*k*\frac{V_{clamp} - V_{tn}}{R + \Delta R * d_{2^m-1+n-m-2}} =$$
$$2^{n-m}*k*\frac{V_b}{R + \Delta R * d_{2^m-1+n-m-2}}$$

$$\vdots$$

$$I_{b_{n-m-1}} =$$
$$2^{n-m-1}*k*\frac{V_{clamp} - V_{tn}}{R + \Delta R * d_{2^m-1+n-m-4}} = 2^{n-m-1}*k*\frac{V_b}{R + \Delta R * d_{2^m-1+n-m-4}}$$

$$I_{b_{n-m-2}} = 2^{n-m-2}*k*\frac{V_{clamp} - V_{tn}}{R + \Delta R * d_{2^m-1+n-m-5}} =$$
$$2^{n-m-2}*k*\frac{V_b}{R + \Delta R * d_{2^m-1+n-m-5}}$$

$$\vdots$$

where n is the number of bits that are converted, m is the number of thermometer coded bits, n-m is the number of binary coded bits, and k is the gain factor. For example, k=1 will result in gain of one with weights of 1, 2, 4, 8, 8 and 8, whereas m=2 will result in weights of 2, 4, 8, 16, 16, and 16. Gain factor k can be written as $k=2^p$, where p is an additional bit of resolution for MNVDAC 400a, above and beyond the inherent n bits. At p=0, k=1 no additional resolution is achieved and there is no change in signal-to-noise-ratio (SNR), but at p=1, k=2 one additional bit of resolution is achieved and a 6 db increase in SNR is achieved. Variable p can be any positive real number.

In binarizer 468 currents I0, I1, I2, I3, I4 and I5 are binarily and unarily weighted and amplified via current mirrors formed by PMOS transistor pairs such as 470 and 481. Pairs 470 and 481 multiply current I5 by eight since the width W of PMOS transistor 481 is 8 times width W of PMOS transistor 470. Similarly, PMOS transistor pair 471 and 480 have a one to eight relationship, PMOS transistor pair 472 and 479 have a one to eight width W ratio, PMOS transistor pair 473 and 478 have a one to four width W ratio, PMOS transistor pair 474 and 477 have a one to two width W ratio, and PMOS transistor pair 475 and 476 have a one to one width W ratio.

MNVDAC 400a is a segmented five bit DAC which comprises six memory cells 215, six clamp transistors, six weighted current mirrors or conveyors, a six input summer, and a current to voltage converter. Therefore, the new system and methodology of MNVDAC 400a is capable of converting five bits of stored digital data to an analog value. It should be understood by those skilled in the art that a higher or lower number of stored bits of data can be converted through simple modifications. For example, an eight bit segmented DAC with a 3 bit thermometer coded 4×7 array and a 5 bit binary coded 4×5 array can be implemented. This 8 bit DAC would include a twelve bit conversion path including twelve memory cells 215, twelve clamp transistors, twelve weighted current mirrors or conveyors, a twelve input summer, and a current to voltage converter.

Figure 4B:
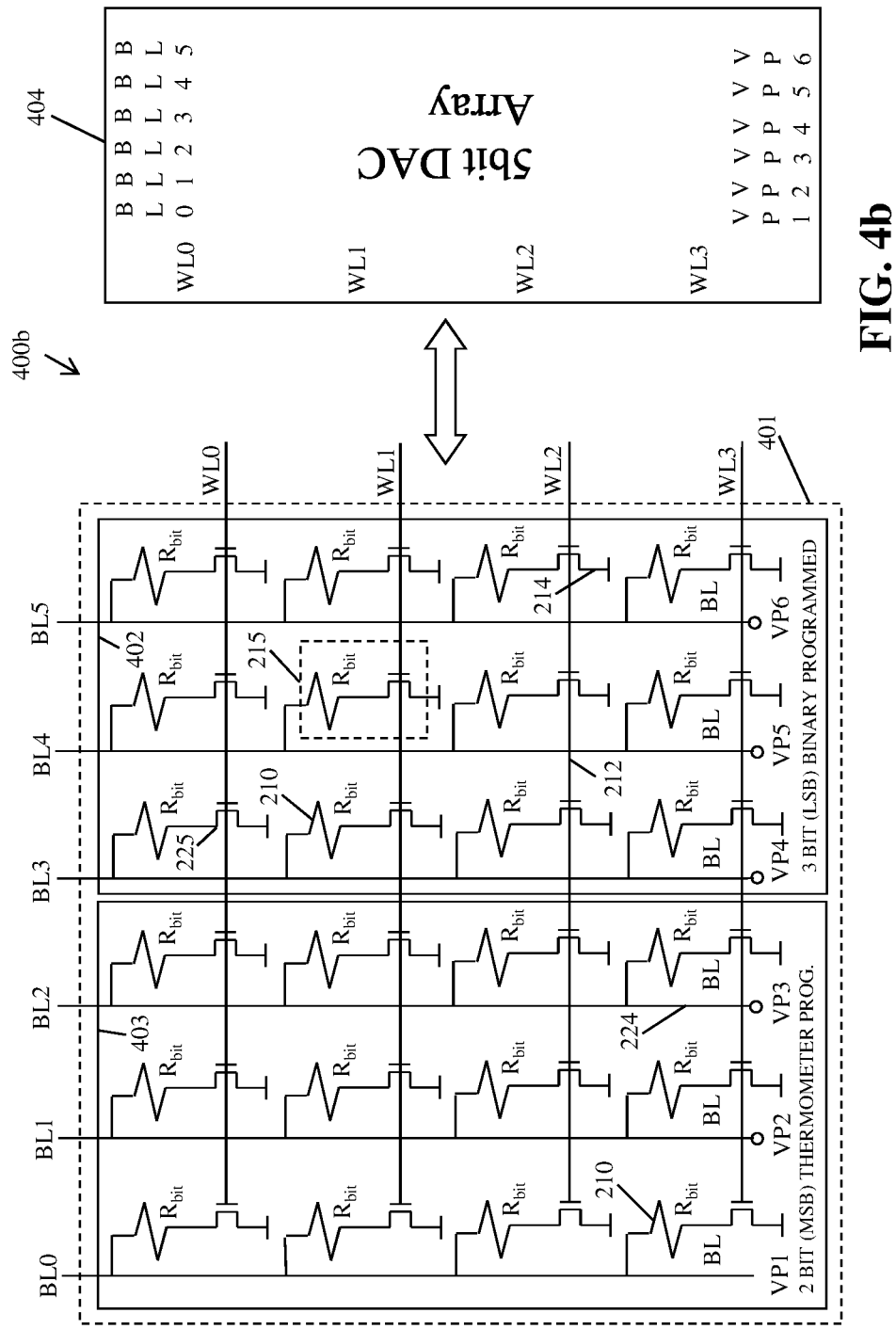
FIG. 4b is a diagram of an implementation of a segmented (unary-binary) 5 bit MNVDAC memory array macro.
Figure 4C:
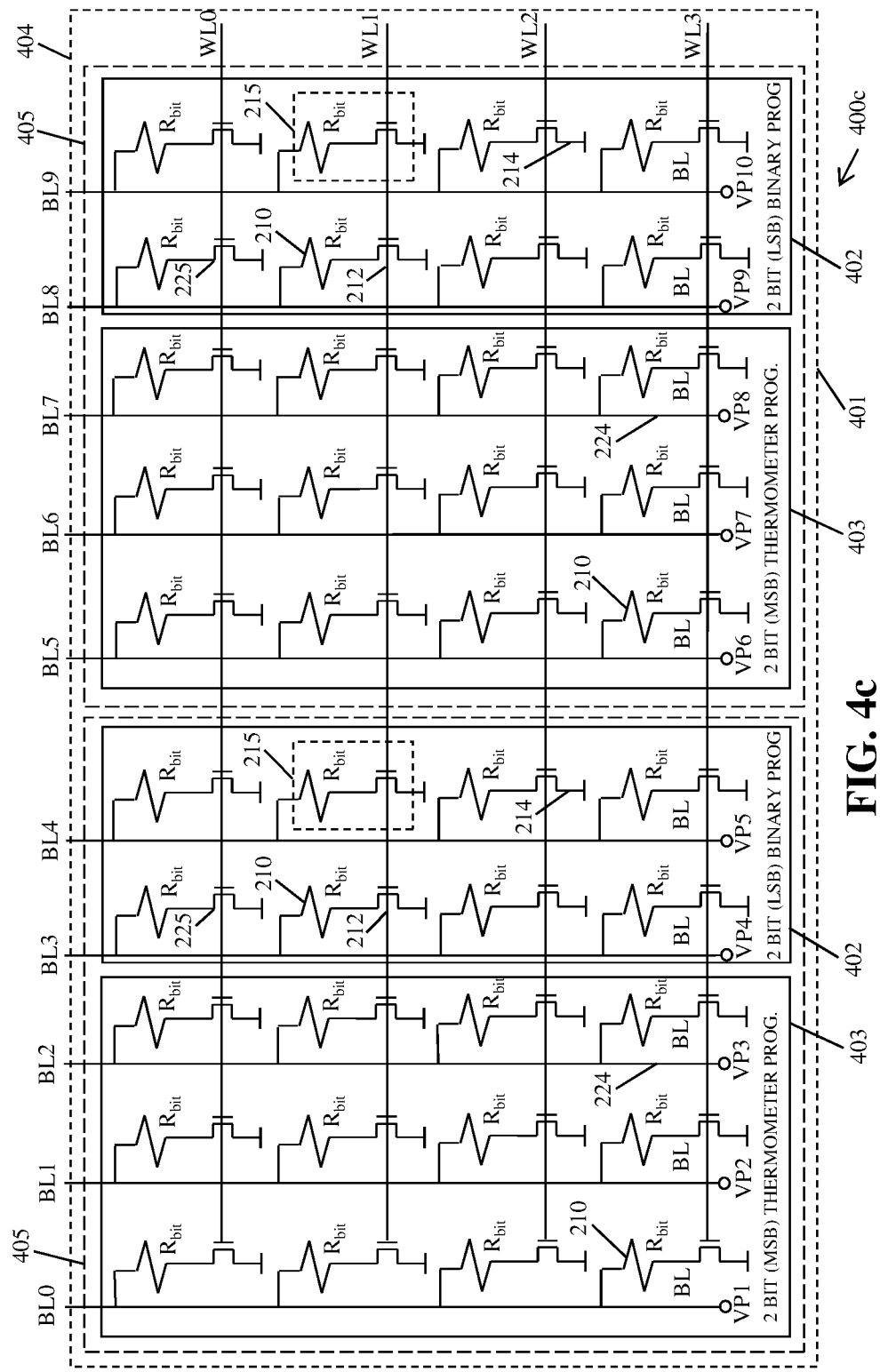
FIG. 4c is a diagram of an implementation of a segmented (unary-binary) 8 bit MNVDAC memory array macro.

Here it should be understood that memory array 401 in FIG. 4a can be used to form larger memory arrays. Therefore, array 401 is illustrated separately in FIG. 4b, herein designated as macro portion 404 (used to form MNVDAC 400b) and as a simplified block in FIG. 4d. For example, in FIG. 4b, array 401 shows a 4×6 array comprised of a 4×3 thermometer coded array 403, and another 4×3 binary coded array 402. However, the arrays can be expanded in units of macro portions 404 to store more DAC codes. For example, a number of macro portions 404 can be assembled in x- and y-directions to store any number of 5 bit DAC codes in MNVDAC. While macro portion 404 is partitioned for a 5 bit segmented DAC, a larger size DAC requires a larger macro portion with a different segmentation and weights in binarizer. For example as stated earlier an eight bit segmented DAC requires a 4×7 thermometer coded array 403 and a 4×5 binary coded array 402. Alternatively, as illustrated in FIG. 4c an eight bit DAC can be formed by combining two segmented four bit Sub-DACs 405 in MNVDAC 400c, where each 4 bit segmented Sub-DAC requires a 4×3 thermometer coded array 403 and a 4×2 binary coded array 402. The binarizer will multiply first Sub-DAC 405 currents I4, I3, and I2 by unary weights $2^2(4)$, and currents I1 and I0 with binary weights $2^1(2)$ and $2^0(1)$, respectively, while a second Sub-DAC 405 receives additional weight factors of $2^4(16)$. As a result, outputs of the binarizer 468 are stated as follows:

$$I_{2u2} = 4*16*k*\frac{V_{clamp} - V_{tn}}{R + \Delta R * d_9} = 4*16*k*\frac{V_b}{R + \Delta R * d_9}$$

$$I_{2u1} = 4*16*k*\frac{V_{clamp} - V_{tn}}{R + \Delta R * d_8} = 4*16*k*\frac{V_b}{R + \Delta R * d_8}$$

$$I_{2u0} = 4*16*k*\frac{V_{clamp} - V_{tn}}{R + \Delta R * d_7} = 4*16*k*\frac{V_b}{R + \Delta R * d_7}$$

$$I_{2b1} = 2*16*k*\frac{V_{clamp} - V_{tn}}{R + \Delta R * d_6} = 2*16*k*\frac{V_b}{R + \Delta R * d_6}$$

$$I_{2b0} = 1*16*k*\frac{V_{clamp} - V_{tn}}{R + \Delta R * d_5} = 1*16*k*\frac{V_b}{R + \Delta R * d_5}$$

$$I_{1u2} = 4*k*\frac{V_{clamp} - V_{tn}}{R + \Delta R * d_4} = 4*k*\frac{V_b}{R + \Delta R * d_4}$$

$$I_{1u1} = 4*k*\frac{V_{clamp} - V_{tn}}{R + \Delta R * d_3} = 4*k*\frac{V_b}{R + \Delta R * d_3}$$

$$I_{1u0} = 4*k*\frac{V_{clamp} - V_{tn}}{R + \Delta R * d_2} = 4*k*\frac{V_b}{R + \Delta R * d_2}$$

-continued $$I_{1b1} = 2*k*\frac{V_{clamp} - V_{tn}}{R + \Delta R * d_1} = 2*k*\frac{V_b}{R + \Delta R * d_1}$$

$$I_{1b0} = 1*k*\frac{V_{clamp} - V_{tn}}{R + \Delta R * d_0} = 1*k*\frac{V_b}{R + \Delta R * d_0}$$

where, I2$u$2, I2$u$1, I2$u$0, I2$b$1, and I2$b$0 are unary and binary weighted currents of a second Sub-DAC 405, and I1$u$2, I1$u$1, I1$u$0, I1$b$1, and I1$b$0 are unary and binary weighted currents of a first Sub-DAC 405. A ten input summer will sum the ten weighted currents. Therefore, this embodiment of MNVDAC 400*a* is a segmented eight bit DAC, which comprises ten memory cells 215, ten clamp transistors, ten weighted current mirrors or conveyors, a ten input summer, and a current to voltage converter.

In general, an n bit segmented MNVDAC can be partitioned into two or more segmented Sub-DACs, where level of partition and segmentation of the Sub-DACs depends on area and required accuracy and resolution of the MNVDAC.

Figure 4D:
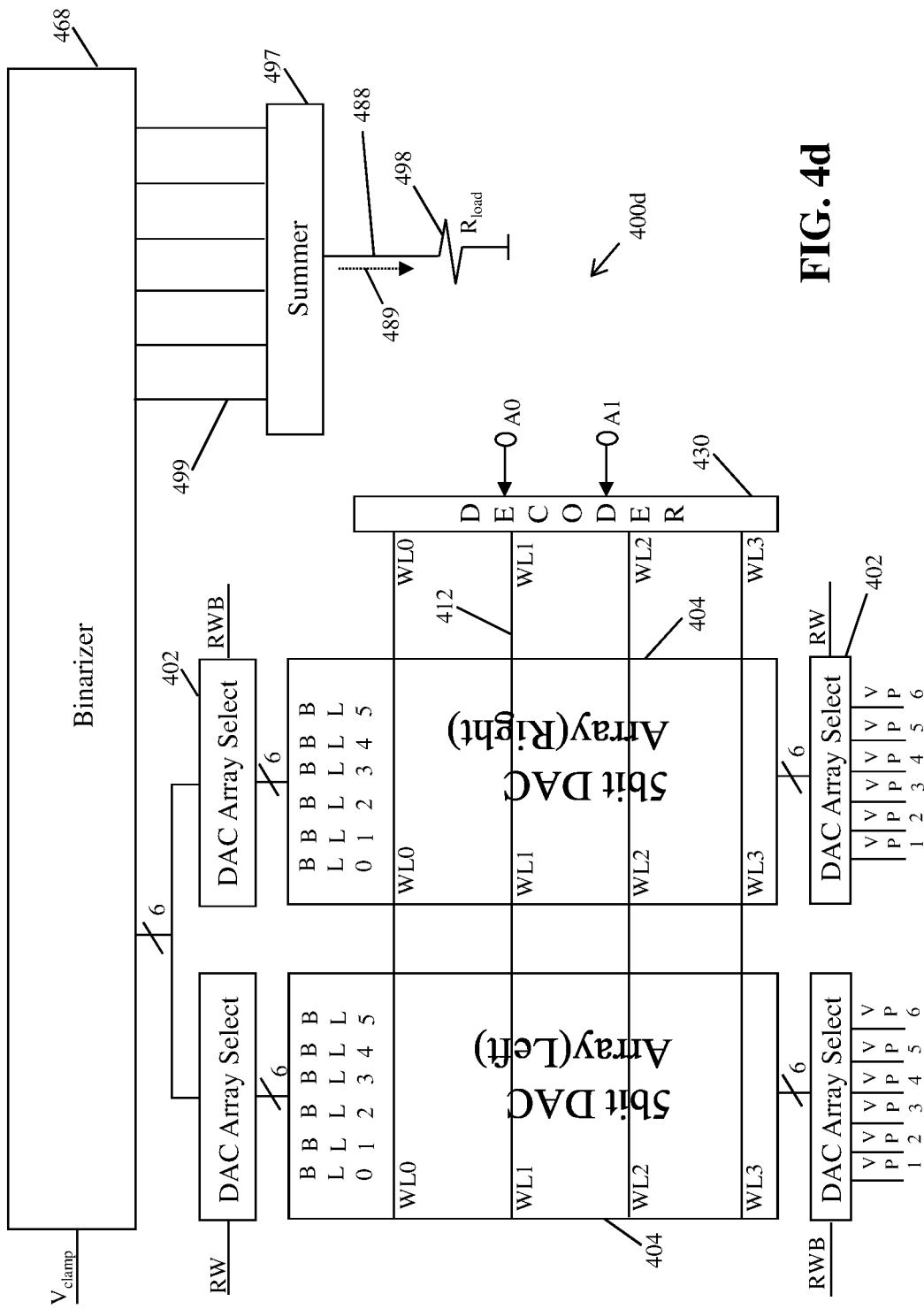
FIG. 4d is a diagram of an implementation of a segmented (unary-binary) 5 bit MNVDAC with dual memory array macros.

Referring to FIG. 4*d*, DAC 400*d* is illustrated in which two macro portions 404 are combined as described above in conjunction with the architecture of FIG. 4*a*. In DAC 400*d* it can be seen that macro portions 404 are coupled to DAC array select blocks 402, and DAC array select blocks 402 are coupled to binarizer 468. Macro portions 404 are coupled to decoder 430, through word lines 412, where decoder 430 decodes address input A0 and A1 to select one of word lines 412. DAC array select blocks 402 are coupled to control inputs RW and RWB, where RW and RWB have an inverse relationship. Assertion of RW enables the DAC array select block coupled to the RW control input and disables the DAC array select block coupled to the RWB control input. Similarly, de-assertion of RW disables the DAC array select block coupled to the RW control input and enables the DAC array select block coupled to the RWB control input. Furthermore, lower DAC array select blocks 402 are coupled to voltage or current sources VP1 through VP6. Binarizer 468 in FIG. 4*d* is the same as the binarizer illustrated in FIG. 4*a*, therefore, it can be understood by reading an earlier description of binarizer 468. Binarizer 468 is coupled to summer 497, and finally summer 497 is coupled to current to voltage converter 498.

DAC 400*d* in FIG. 4*d* is a five bit DAC, where each left and right DAC array 404 stores four segmented 6 bit codes for conversion with a total capacity of eight codes. As illustrated in physical code map 400*e* in FIG. 4*e* sequential or random codes can be stored in the MNVDAC 400*d*. Twelve storage and conversion cycles are displayed in FIG. 4*e*, where cycles one through four store four six bit codes in left DAC array and convert 6 bits stored in right DAC array. Cycles five through eight store four six bit codes in right DAC array and convert 6 bits stored in left DAC array. Cycles nine through twelve store four six bit codes in left DAC array and convert 6 bits stored in right DAC array. Conversion cycles 1 through 4 in right DAC are not valid as there is no data stored in MNVDAC 400*d* at startup.

Figure 4F:
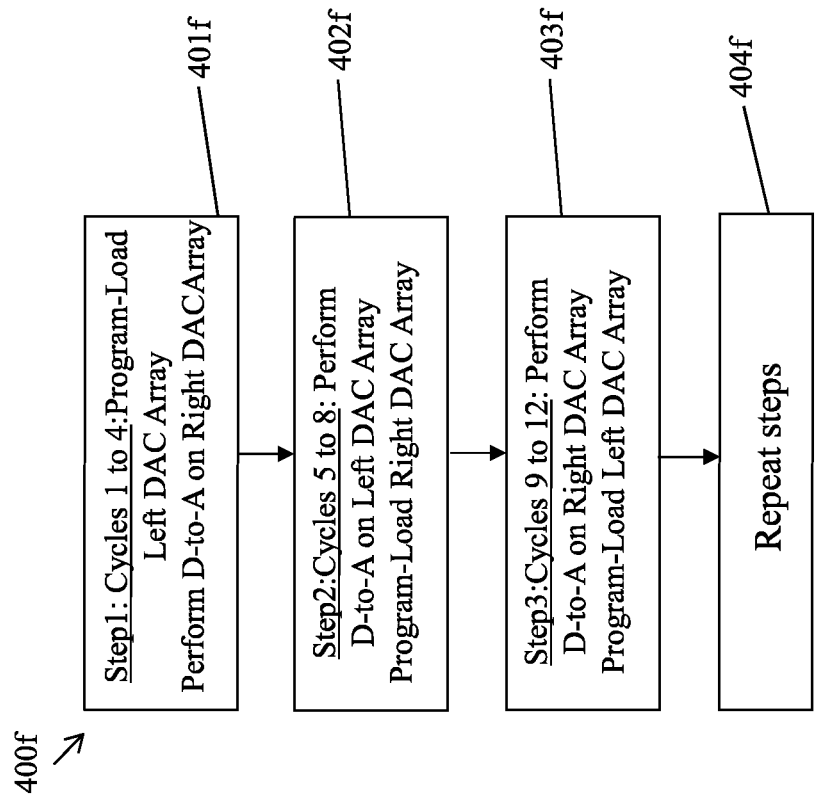
FIG. 4f is a flow chart of an implementation of a segmented (unary-binary) MNVDAC conversion process.

Referring to FIG. 4*f*, flow diagram 400*f* of MNVDAC 400*d* is illustrated. At 401*f* left DAC array is sequentially loaded with digital data by programming or erasing the individual memory cells on wordlines WL0 through WL3 during cycles one through four shown in FIG. 4*f*. At the same time, a DAC conversion takes place on right DAC array by sequentially converting digital data in memory cells on wordlines WL0 through WL3 during cycles one through four. This is accomplished by row addresses sequentially decoded in Decoder 430, RWB asserted, RW de-asserted, and VP1 through VP6 supplying positive or negative voltages or currents. The converted analog output of right DAC array is not valid in step 1, as mentioned above. In step 2, at 402*f*, the opposite takes place, where the right DAC array is sequentially loaded with digital data by programming or erasing the individual memory cells on wordlines WL0 through WL3 during cycles five through eight shown in FIG. 4*f*. At the same time, a DAC conversion takes place on the left DAC array by sequentially converting digital data in memory cells on wordlines WL0 through WL3 during cycles five through eight. This is accomplished by row addresses sequentially decoded in Decoder 430, RWB de-asserted, RW asserted, and VP1 through VP6 supplying positive or negative voltages or currents. Similarly, in step 3, at 403*f* the left DAC array is sequentially loaded with digital data by programming or erasing the individual memory cells on wordlines WL0 through WL3 during cycles nine through twelve shown in FIG. 4*f*. At the same time, a DAC conversion takes place on the right DAC array by sequentially converting digital data in memory cells on wordlines WL0 through WL3 during cycles nine through twelve. Thereafter the same steps are repeated as the system controller and incoming data requires. MNVDAC 400*d* accomplishes a DAC conversion without latency. Conversion output is available in every cycle except the first four cycles, where the conversion result of the right DAC array is not valid and should be discarded.

Figure 5A:
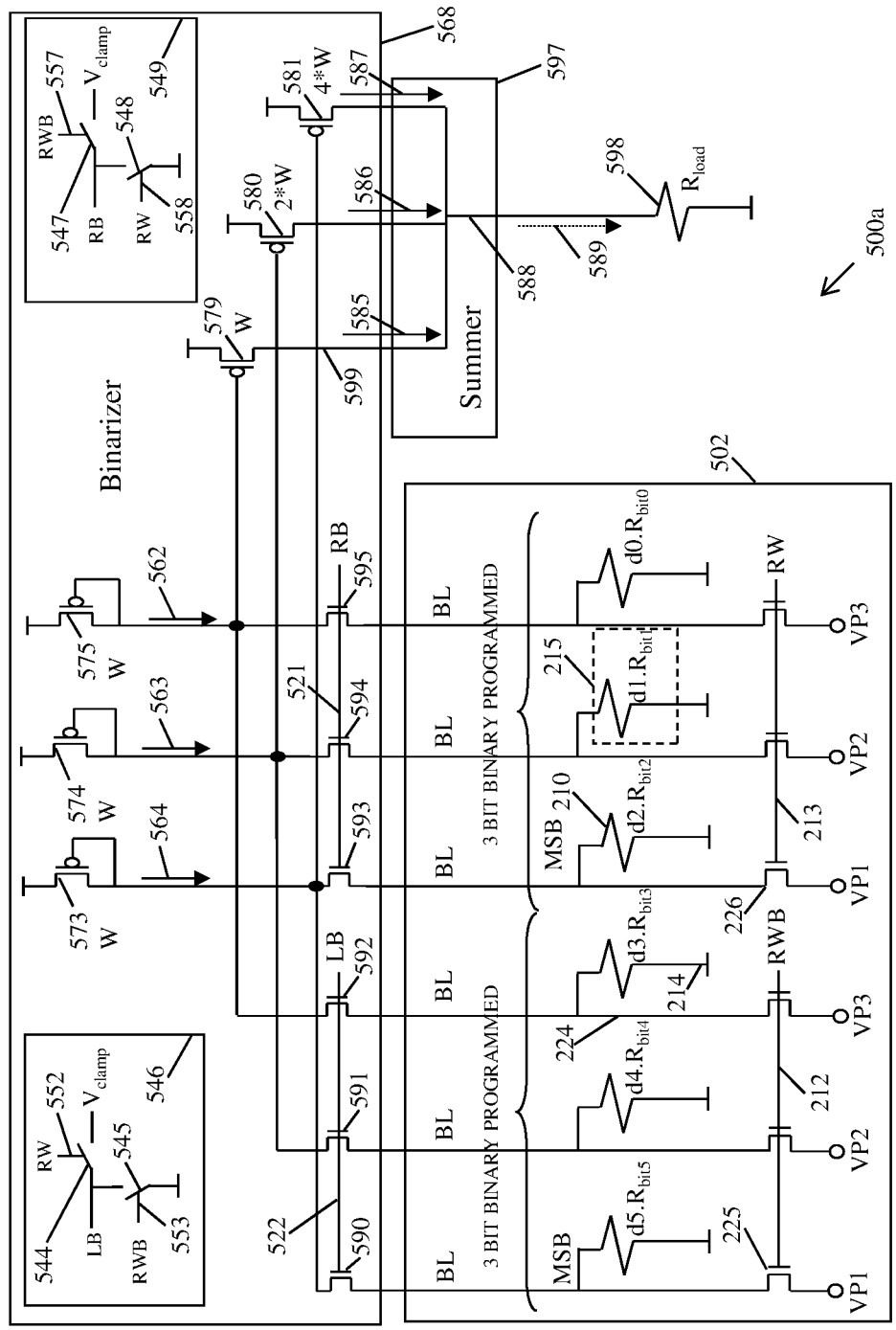
FIG. 5a is a simplified diagram of an implementation of a binary MNVDAC.

FIG. 5*a* is another embodiment of a resistance-based MNVDAC. MNVDAC 500*a* includes a plurality of memory cells 215 arranged only in columns, where individual memory elements 210 can be any type of resistive memory element (RME). For convenience of illustration, while it will be understood that a smaller or larger number of columns could be used if desired, in this example memory array 502 includes a 1×6 array of resistive memory cells 215 arranged in one row and six columns.

Memory cell 215 includes a resistive memory element (RME), electrically represented as a resistor 210 coupled to bitline 224. In implementations the RME may be a spin-transfer torque magneto-resistive random access memory (STT-MRAM) element or a FLASH cell in memory array 502. Generally, the information stored in memory cell 215 is interrogated by supplying a conversion current to one end of resistors 210, $R_{bit}$ and by grounding the second terminal of resistor 210. In this embodiment, memory consists of a single row, and it does not need any isolation devices. Furthermore, wordlines and associated decoders and drivers have been eliminated. Memory array 502 includes a plurality of bit lines 224 coupled to binarizer 568, and outputs 599 of binarizer 568 are coupled to summer 597. The single output of summer 597 is coupled to current to voltage converter 598, which generates analog output voltage. In addition, bit lines 224 are coupled to program switches 225, and 226, and program switches 225 and 226 are coupled to voltage or current source terminals VP1 through VP3. Program switches in FIG. 5*a* are depicted as NMOS transistor switches, where control terminals 212 and 213 are coupled to inputs RW and RWB. RW and RWB have an inverse relationship. During loading of DAC codes into MNVDAC voltage clamp transistors 590, 591, and 592, or 593, 594, and 595 are alternatively placed in cut-off state thereby isolating MNVDAC memory array 502 from binarizer 568. VP1 through VP3 are continuously supplied with a positive voltage or current representing a DAC bit of logical 1(0), or negative voltage or negative current representing a DAC bit of logical 0(1).

The conversion path MNVDAC 500a includes a binarizer 568 comprising voltage clamping transistors 590 through 595 and load transistors 573 through 575. In implementations the load transistors 573 through 575 may be diode connected PMOS load transistors. Diode connected transistors have a gate that is coupled to their drain. Load transistors 573 and 581 form a current copier and multiplier configuration commonly known in the art as a current mirror or conveyor. Load transistor 574 and 575 form the same current mirror configuration with transistors 580 and 579, respectively. Load transistors 573, 574, and 575 are coupled to clamp transistors 590 through 595. Voltage clamp transistors 590 through 592 are coupled to a control terminal 522, which is coupled to switch network 546. Alternately, voltage clamp transistors 593 through 595 are coupled to a control terminal 521, which is coupled to switch network 549. Switch network 546 includes switch 544 having a first input coupled to a clamp voltage $V_{clamp}$ and a second input coupled to output terminal LB and to a second terminal of switch 545. Switch 545 has a first input coupled to ground potential and control terminal 553 is coupled to input RWB. Control terminal 552 of switch 544 is coupled to input RW. Switch network 549 includes switch 547 having a first input coupled to a clamp voltage $V_{clamp}$ and a second input coupled to output terminal RB and to a second terminal of switch 548. Switch 548 has a first input coupled to ground potential and a control terminal 558 coupled to input RW. Control terminal 557 of switch 547 is coupled to input RWB. The clamp transistors 590 through 595 are coupled to bit lines 224, which are in turn coupled to resistive memory elements 210 of the corresponding memory cells 215. Resistive memory elements (RMEs) 210 may each include a magnetic tunnel junction (MTJ) illustrated as a resistance Rbit, which includes a logic "0" or logic"1" resistance value. Resistive elements other than MTJs may be used (in this as in other implementations).

MNVDAC 500a operates in current mode, where voltage is forced and current is measured. Current mode of read operation offers high speed and bandwidth, and substantial area savings. In other implementations a voltage mode of read operation could be utilized. In current mode of read operation, binarizer 568 in MNVDAC 500a includes a voltage clamping feature, where clamp transistors 590 through 595 clamp the bit lines 224 to $V_{clamp}$-$V_{tn}$, where $V_{tn}$ is threshold voltage of NMOS clamp transistors 590 through 595, and $V_{clamp}$ is a selected bias voltage. The $V_{clamp}$-$V_{tn}$ referred to as bit line 224 bias voltage (hereafter Vb). Clamping forces the bit lines 224 to a constant bias voltage (ignoring random $V_{tn}$ variations) thereby virtually eliminating voltage swings on bit lines 224. Load transistors 573, 574, and 575 in binarizer 568 are coupled to clamp transistors 590, 591, 592, 593, 594, and 595 to generate each data signal. Each data signal is represented as one of current values 562 (I0), 563 (I1), and 564 (I2). Currents I0, I1, and I2 are binarized while flowing through binarizer 568 generating binary weighted currents 585 (Ib0), 586 (Ib1), and 587 (Ib2), where the I0, Ib0 pair are the least-significant-bit (LSB) pair and the I2, Ib2 pair are the most-significant-bit (MSB) pair. Currents Ib0, Ib1, and Ib2 are summed via summer 597 represented in FIG. 5a as 589 (Iout) into node 588. Summer 597 in MNVDAC 500a is a simple wire sum based on Kirchoff's current law, which is coupled to current to voltage converter 598.

Referring to FIG. 5a, clamp transistors 590, 591, 592 have control input LB coupled to a control line 522, where control line 522 is coupled to switch network 546. Switch network 546 drives control input LB through control line 522 to either selected bias voltage Vclamp or zero volts. Program switches 225 have control input RWB coupled to a control line 212. Control inputs RW and RWB have an inverse relationship. When RW is at logic level of "zero", and RWB is at logic level of "one", switch network 546 drives control line 522 to zero volts. Independently, control line 212 is driven to a logic "one" level, thereby placing clamp transistors 590, 591, and 592 in cut-off, and program switches 225 in conduction state resulting in programming of RMEs 210 labeled as $R_{bit5}$, $R_{bit4}$, and $R_{bit3}$.

Continuing with FIG. 5a, clamp transistors 593, 594, and 595 have control input RB coupled to a control line 521, where control line 521 is coupled to switch network 549. Switch network 549 drives control input RB through control line 521 to either selected bias voltage Vclamp or zero volts. Program switches 226 have control input RW coupled to a control line 213. Control inputs RW and RWB have an inverse relationship. When RW is at logic level of "zero", and RWB is at logic level of "one", switch network 549 drives control line 521 to selected bias voltage $V_{clamp}$. Independently, control line 213 is driven to a "zero" level, thereby placing clamp transistors 593, 594, and 595 in conduction state and program switches 226 in cut-off resulting in digital-to-analog conversion of digital information stored in RMEs 210 labeled as $R_{bit2}$, $R_{bit1}$, and $R_{bit0}$.

Alternately, in FIG. 5a when RW is at a logical state of "one" and RWB is at a logical state of "zero" switch network 546 drives control line 522 to selected bias voltage $V_{clamp}$. Independently, control line 212 is driven to a logic zero level, thereby placing clamp transistors 590, 591, and 592 in conduction state, and program switches 225 in cut-off resulting in digital-to-analog conversion of digital information stored in RMEs 210 labeled as $R_{bit5}$, $R_{bit4}$, and $R_{bit3}$. Similarly, when RW is at a logical state of "one", and RWB is at a logic state of "zero", switch network 549 drives control line 521 to zero volts. Independently, control line 213 is driven to a logic one level, thereby placing clamp transistors 593, 594, and 595 in cut-off and program switches 226 in conduction state resulting in programming of RMEs 210 labeled as $R_{bit2}$, $R_{bit1}$, and $R_{bit0}$).

In MNVDAC 500a, a resistance Rbit of the resistive memory element 210 can be either set to a logical "0" state, resulting in a low resistance setting, R, or set to a logical "1" state, resulting in a high resistance setting, R+$\Delta$R. Therefore, Rbit can be stated as $$R_{bit} = R + \Delta R * d_n'$$

where n' is a non-negative integer. In a logical "0" state Rbit=R, since $d_n$=0, and in a logical "1" state Rbit=R+$\Delta$R, since $d_n$=1. Consequently, currents I2, I1, and I0 are stated as $$I_2 = \frac{V_{clamp} - V_{tn}}{R + \Delta R * (d_2 * RWB + d_5 * RW)} = \frac{V_b}{R + \Delta R * (d_2 * RWB + d_5 * RW)}$$

$$I_1 = \frac{V_{clamp} - V_{tn}}{R + \Delta R * (d_1 * RWB + d_4 * RW)} = \frac{V_b}{R + \Delta R * (d_1 * RWB + d_4 * RW)}$$

$$I_0 = \frac{V_{clamp} - V_{tn}}{R + \Delta R * (d_0 * RWB + d_3 * RW)} = \frac{V_b}{R + \Delta R * (d_0 * RWB + d_3 * RW)}$$

Above listed equations for currents I0, I1, and I2 demonstrate that they are a function of input digital code or data written into six RMEs coupled to one word line. Subsequently, currents I0, I1, and I2 are further processed in binarizer 568, where they are binarily weighted in a manner that corresponds to the significance of that bit in the digital input data, which was written into six RMEs during alternating program cycles. That is, I0 (the LSB) as a function of d0 or d3 gets multiplied by $2^0$, i.e., one unit of current, I1 (MSB-1) as a function of d1 or d4 gets multiplied by $2^1$, i.e., two units of current, and I2 (MSB) as a function of d2 or d5 gets multiplied by $2^2$ i.e., four units of current. Furthermore, currents I0, I1, and I2 can be amplified in addition to receiving binary weights. This translates into a base binarizer 568 gain, which increases effective RME signal and multiplies least-significant-bit (LSB) current by a factor m. As a result, outputs of the binarizer 568 are stated as $$I_{b2} = 4*m* \frac{V_b}{R + \Delta R*(d_2*RWB + d_5*RW)}$$

$$I_{b1} = 2*m* \frac{V_b}{R + \Delta R*(d_1*RWB + d_4*RW)}$$

$$I_{b0} = m* \frac{V_b}{R + \Delta R*(d_0*RWB + d_3*RW)}$$

In general, binarizer 568 output currents can be stated as $$I_{b_{n-3}} = 2^{n-1}*m* \frac{V_b}{R + \Delta R*(d_{n-1}*RWB + d_{n+2}*RW)}$$

$$I_{b_{n-3}} = 2^{n-2}*m* \frac{V_b}{R + \Delta R*(d_{n-2}*RWB + d_{n+1}*RW)}$$

$$I_{b_{n-3}} = 2^{n-3}*m* \frac{V_b}{R + \Delta R*(d_{n-3}*RWB + d_{n+0}*RW)}$$

$$\vdots$$

where n is equal to the number of bits that are converted, or RMEs which are binarized and summed, and m is the binarizer 568 gain factor. For example, m=1 will result in gain of one with binary weights of 1, 2, and 4, whereas m=2 will result in binary weights of 2, 4, and 8. Gain factor m can be written as $m=2^k$, where k is an additional bit of resolution for MNVDAC 500a above and beyond the inherent n bits. At k=0, m=1 no additional resolution is achieved, and there is no change in signal-to-noise-ratio (SNR), but at k=1, m=2 one additional bit of resolution is achieved and a 6 db increase in SNR is achieved. Variable k can be any positive real number.

In binarizer 568 currents I0, I1, and I2 are binarily weighted and amplified via current mirrors formed by PMOS transistor pairs such as 581 and 573. Pair 573 and 581 multiplies current I2 by four since the width W of PMOS transistor 581 is four times width W of PMOS transistor 573. Similarly, PMOS transistor pair 574 and 580 have a one to two relationship, and PMOS transistor pair 575 and 579 have a one to one width W ratio.

MNVDAC 500a is a three bit DAC, which includes six memory cells 215, six clamp transistors, three weighted current mirrors or conveyors, a three input summer, and a current to voltage converter. Therefore, the system and methodology of MNVDAC 500a is capable of converting three bits of stored digital data to an analog value. It should be understood by those skilled in the art that a higher or lower number of stored bits of data can be converted through simple modifications. For example, an eight bit DAC with an eight bit conversion path can be implemented if the conversion path includes sixteen memory cells 215, sixteen clamp transistors, eight weighted current mirrors or conveyors, an eight input summer, and a current to voltage converter. Other implementations may include fewer or more bits, as desired, as will be understood by the practitioner of ordinary skill in the art.

MNVDAC 500a in FIG. 5a is a three bit DAC, where a six bit array 502 stores two three-bit codes for conversion. As illustrated in physical code map 500b in FIG. 5b sequential or random codes can be stored in the MNVDAC 500a. Nine storage and conversion cycles are displayed in FIG. 5b, where odd cycles store 3 bits into RMEs 210 labeled as $R_{bit5}$, $R_{bit4}$, and $R_{bit3}$, and convert 3 bits stored within $R_{bit2}$, $R_{bit1}$, and $R_{bit0}$. Similarly, even cycles store 3 bits into RMEs 210 labeled as $R_{bit2}$, $R_{bit1}$, and $R_{bit0}$, and convert 3 bits stored within $R_{bit5}$, $R_{bit4}$, and $R_{bit3}$. First cycle conversion is not valid as there is no data stored in MNVDAC 500a at startup, and final cycle digital data storage in $R_{bit5}$, $R_{bit4}$, and $R_{bit3}$ is a do-not-care(xxx). A do-not-care value implies that the value of digital code stored in the final cycle has no impact on the conversion curve of three bit MNVDAC 500a.

Figure 5C:
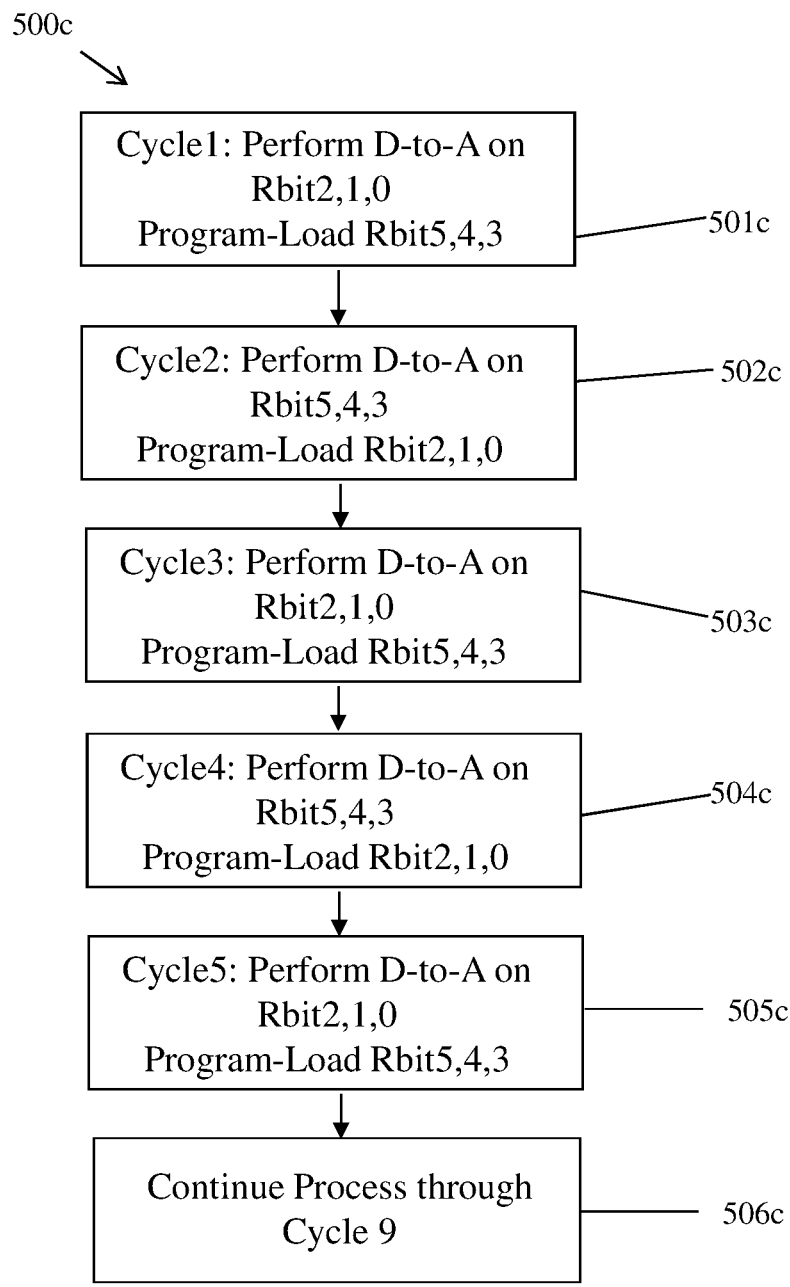
FIG. 5c is a flow chart of an implementation of a binary MNVDAC conversion process.

Referring to FIG. 5c, flow diagram 500c of MNVDAC 500a is illustrated. At 501c RMEs 210 labeled as $R_{bit5}$, $R_{bit4}$, and $R_{bit3}$ are loaded with digital data, and digital data in RMEs 210 labeled as $R_{bit2}$, $R_{bit1}$, and $R_{bit0}$ get converted to an analog value, where the converted analog value is not valid due to the reason mentioned earlier. In cycle 2 at 502c a digital-to-analog conversion takes place on $R_{bit5}$, $R_{bit4}$, and $R_{bit3}$, while digital data is programmed into RMEs 210 labeled as $R_{bit2}$, $R_{bit1}$, and $R_{bit0}$. Cycles 3 through 9 continue by alternating programming and conversion between $R_{bit5}$, $R_{bit4}$, $R_{bit3}$ and $R_{bit2}$, $R_{bit1}$, $R_{bit0}$. This is accomplished by de-asserting RWB during odd cycles, and de-asserting RW during even cycles. MNVDAC 500a accomplishes a DAC conversion without latency. Conversion output is available in every cycle except the first cycle, where the conversion result of $R_{bit2}$, $R_{bit1}$, $R_{bit0}$ is not valid, and should be discarded. The addition of cycle 9 mitigates the absence of output in cycle 1.

Figure 5D:
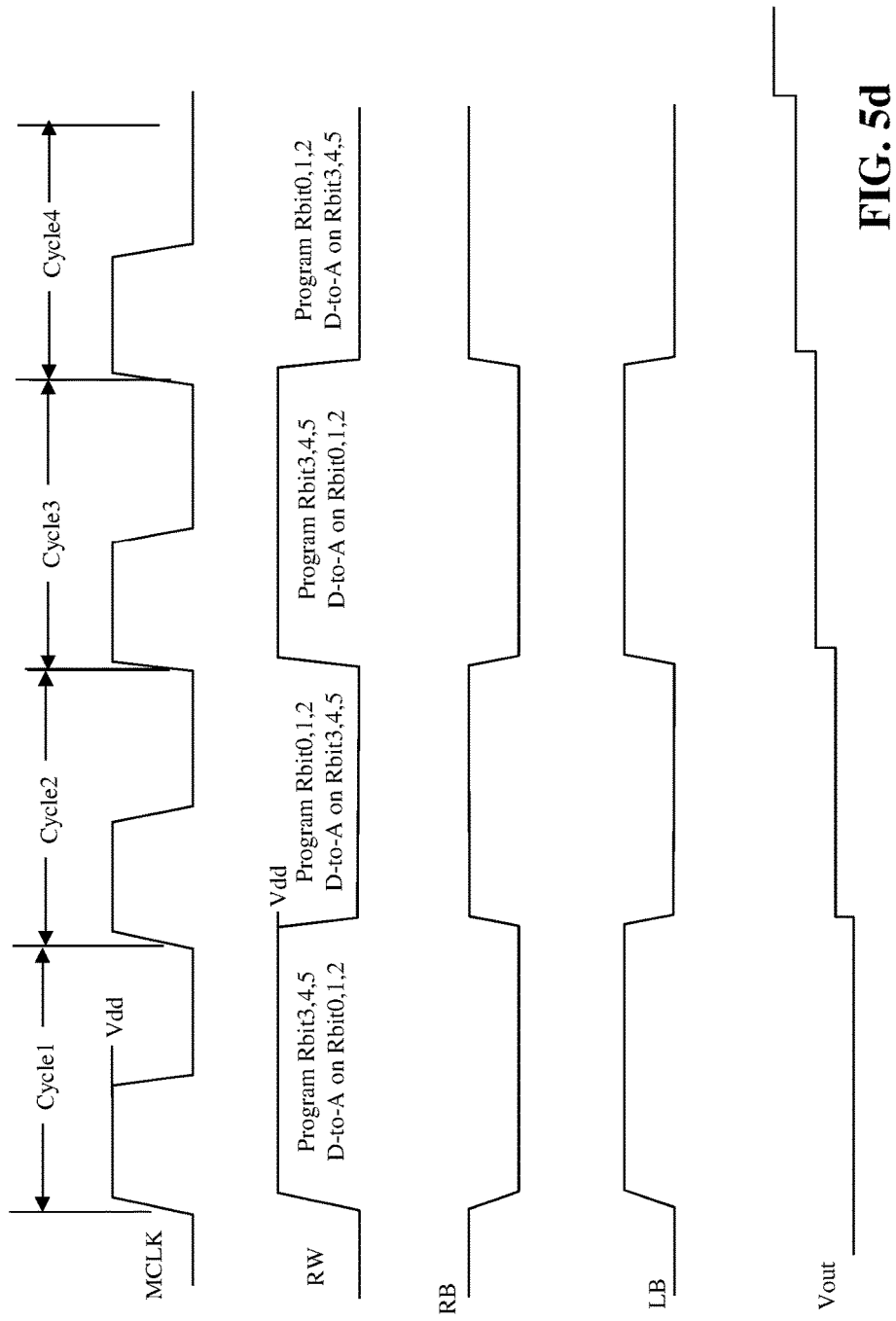
FIG. 5d is a timing diagram of an implementation of a binary MNVDAC.

Turning to FIG. 5d, a typical timing diagram of the MNVDAC 500a of FIG. 5a is depicted. Upon the rising edge of master clock, MCLK, signal RW is asserted and de-asserted at a frequency equal to one half of MCLK. Subsequently, LB and RB signals are periodically toggled at the same frequency as the RW signal. Each cycle in four cycles shown performs both programming and digital-to-analog conversion, and analog output Vout of MNVDAC 500a is always valid at the end of each cycle prior to the following cycle.

Figure 6:
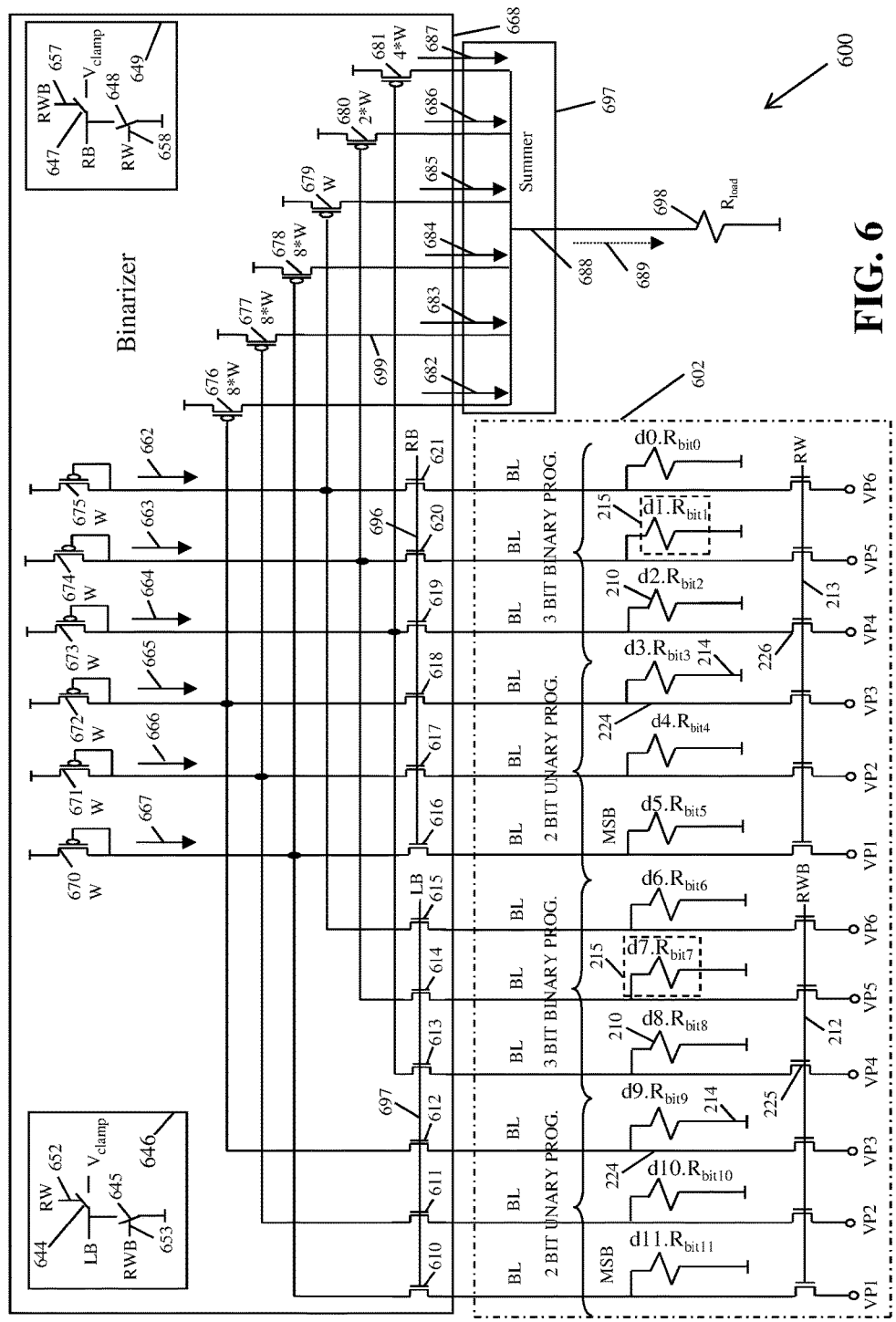
FIG. 6 is a simplified diagram of an implementation of a segmented (unary-binary) MNVDAC.

FIG. 6 illustrates MNVDAC 600 similar in some ways to MNVDAC 500a but having a segmented architecture, where the memory array and binarizer are segmented. A segmented MNVDAC architecture combines a thermometer coded memory array with a binary coded memory array and a binarizer. The term binarizer is still maintained in this embodiment even though the binarizer is segmented and not purely binary-weighted.

In an n bit segmented MNVDAC, the first m MSB bits of n bit input digital code is converted with thermometer coded memory array and a unary weighted binarizer, and the other n-m LSB bits are converted with a binary-coded memory array and a binary weighted binarizer. The thermometer coded memory array has $2^m-1$ columns, and the binary-coded memory array has n-m columns. The thermometer portion of the binarizer receives a uniform weight of $2^{n-m}$, and the binary-weighted portion of the binarizer receives decreasing binary weights beginning with $2^{n-m-1}$. For reasons stated earlier a segmented MNVDAC has some advantages over an exclusively binary or unary MNVDAC.

MNVDAC 600 in FIG. 6 includes a plurality of memory cells 215 arranged only in columns, where individual memory elements 210 can be any type of resistive memory element (RME). For convenience of illustration, while it will be understood that a smaller or larger number of columns could be used if desired, in this example memory array 602 includes a 1×12 array of resistive memory cells 215 arranged in one row and twelve columns.

Memory cell 215 includes a resistive memory element (RME), electrically represented as a resistor 210 coupled to bitline 224. In implementations the RME may be a spin-transfer torque magneto-resistive random access memory (STT-MRAM) element or a FLASH cell in memory array 602 (though other elements could be used in other implementations). Generally, the information stored in memory cell 215 is interrogated by supplying a conversion current to one end of resistors 210($R_{bit}$) and by grounding the second terminal of resistor 210. In this embodiment, memory consists of a single row, and it does not need any isolation devices. Furthermore, wordlines and associated decoders and drivers have been eliminated. Memory array 602 includes a plurality of bit lines 224 coupled to binarizer 668, and outputs 699 of binarizer 668 are coupled to summer 697. The single output of summer 697 is coupled to current to voltage converter 698, which generates analog output voltage. In addition, bit lines 224 are coupled to program switches 225, and 226, and program switches 225 and 226 are coupled to voltage or current source terminals VP1 through VP6. Program switches in FIG. 6 are depicted as NMOS transistor switches, where control terminals 212 and 213 are coupled to inputs RW and RWB. RW and RWB have an inverse relationship. During loading of DAC codes into MNVDAC Voltage clamp transistors 610 through 615, or 616 through 621, are alternatively placed in cut-off state thereby isolating MNVDAC memory array 602 from binarizer 668. VP1 through VP6 are continuously supplied with a positive voltage or current representing a DAC bit of logical 1(0), or negative Voltage or negative current representing a DAC bit of logical 0(1).

The conversion path of MNVDAC 600 includes a binarizer 668 comprising voltage clamping transistors 610 through 621, and load transistors 670 through 675. In implementations, the load transistors 670 through 675 may be diode connected PMOS load transistors. Diode connected transistors have a gate that is coupled to their drain. Load transistors 673 and 681 form a current copier and multiplier configuration commonly known in the art as current mirror or conveyor. Load transistors 673, 674, and 675 form current mirror configurations with transistors 681, 680, and 679, respectively. Load transistors 670, 671, and 672 form current mirror configurations with transistors 678, 677, and 676, respectively. Load transistors 673, 674, and 675 are coupled to clamp transistors 619, 620, 621, 613, 614, and 615. Load transistors 670, 671, and 672 are coupled to clamp transistors 616, 617, 618, 610, 611, and 612. Voltage clamp transistors 616 through 621 are coupled to a control terminal 696, which is coupled to switch network 649. Alternately, voltage clamp transistors 610 through 615 are coupled to a control terminal 697, which is coupled to switch network 646. Switch network 646 includes switch 644 having a first input coupled to a clamp voltage $V_{clamp}$, and a second input coupled to output terminal LB and to a second terminal of switch 645. Switch 645 has a first input coupled to ground potential, and control terminal 653 is coupled to input RWB. Control terminal 652 of switch 644 is coupled to input RW. Switch network 649 includes switch 647 having a first input coupled to a clamp voltage $V_{clamp}$, and a second input coupled to output terminal RB and to a second terminal of switch 648. Switch 648 has a first input coupled to ground potential, and control terminal 658 is coupled to input RW. Control terminal 657 of switch 647 is coupled to input RWB. The clamp transistors 610 through 621 are coupled to bit lines 224, which are in turn coupled to resistive memory elements 210 of the corresponding memory cells 215. Resistive memory elements (RMEs) 210 may each include a magnetic tunnel junction (MTJ) illustrated as a resistance Rbit, which includes a logic "0" or logic"1" resistance value (though other resistive memory elements may be used, in this and in other implementations).

MNVDAC 600 operates in current mode, where voltage is forced and current is measured. This allows high speed and bandwidth and substantial area savings. In other implementations a voltage mode of read operation could be utilized. In current mode of read operation, binarizer 668 in MNVDAC 600 includes a voltage clamping feature, where clamp transistors 610 through 621 clamp the bit lines 224 to $V_{clamp}$-$V_{tn}$, where $V_{tn}$ is threshold voltage of NMOS clamp transistors 610 through 621, and $V_{clamp}$ is a selected bias voltage. The $V_{clamp}$-$V_{tn}$ is referred to as bit line 224 bias voltage (hereafter Vb). Clamping forces the bit lines 224 to a constant bias voltage (ignoring random $V_{tn}$ variations) thereby virtually eliminating voltage swings on bit lines 224. Load transistors 670, 671, 672, 673, 674, and 675 in binarizer 668 are coupled to clamp transistors 610, 611, 612, 613, 614, 615, 616, 617, 618, 619, 620, and 621 to generate each data signal. Each data signal is represented as one of current values 662 (I0), 663 (I1), 664 (I2), 665 (I3), 666 (I4), and 667 (I5). Currents I0, I1, I2, I3, I4, and I5 are weighted while flowing through binarizer 668 generating binary weighted currents 685 (Ib0), 686 (Ib1), and 687 (Ib2), and unary weighted currents 682 (Iu0), 683 (Iu1), and 684 (Iu2), where the I0, Ib0 pair is the least-significant-bit (LSB) pair, and the I5, Iu2 pair is the most-significant-bit (MSB) pair. Unary currents Iu0, Iu1, and Iu2 receive a unary weight of $2^{n-m}$ prior to summation. Currents 1b0, Ib1, Ib2, Iu0, Iu1 and Iu2 are summed via summer 697 represented in FIG. 6 as 689 (Iout) into node 688. Summer 697 in MNVDAC 600 is a wire sum based on Kirchoff's current law, which is coupled to current to voltage converter 698.

Still referring to FIG. 6, clamp transistors 610, 611, 612, 613, 614, and 615 have control input LB coupled to a control line 697, where control line 697 is coupled to switch network 646. Switch network 646 drives control input LB through control line 697 to either selected bias voltage Vclamp or zero volts. Program switches 225 have control input RWB coupled to a control line 212. Control inputs RW and RWB have an inverse relationship. When RW is at logical zero and RWB is at logical one, switch network 646 drives control line 697 to zero volts. Independently, control line 212 is driven to a logic one level, thereby placing clamp transistors 610, 611, 612, 613, 614 and 615 in cut-off, and program switches 225 in conduction state resulting in programming of RMEs 210 labeled as $R_{bit11}$, $R_{bit10}$, $R_{bit9}$, $R_{bit8}$, $R_{bit7}$, and $R_{bit6}$.

Clamp transistors 616, 617, 618, 619, 620, and 621 have control input RB coupled to a control line 696, where control line 696 is coupled to switch network 649. Switch network 649 drives control input RB through control line 696 to either selected bias voltage Vclamp or zero volts. Program switches 226 have control input RW coupled to a control line 213. Control inputs RW and RWB have an inverse relationship. When RW is at logic level of "zero", and RWB is at logic level of "one", switch network 649 drives control line 696 to selected bias voltage $V_{clamp}$. Independently, control line 213 is driven to a zero level, thereby placing clamp transistors 616, 617, 618, 619, 620, and 621 in conduction state and program switches 226 in cut-off resulting in digital-to-analog conversion of digital information stored in RMEs 210 labeled as $R_{bit5}$, $R_{bit4}$, $R_{bit3}$, $R_{bit2}$, $R_{bit1}$, and $R_{bit0}$.

Alternately in FIG. 6 when RW is at a logical state of "one", and RWB is at logic state of "zero", switch network 646 drives control line 697 to selected bias voltage $V_{clamp}$. Independently, control line 212 is driven to a logic zero level, thereby placing clamp transistors 610, 611, 612, 613, 614, and 615 in conduction state, and program switches 225 in cut-off resulting in digital-to-analog conversion of digital information stored in RMEs 210 labeled as $R_{bit11}$, $R_{bit10}$, $R_{bit9}$, $R_{bit8}$, $R_{bit7}$, and $R_{bit6}$. Similarly, when RW is at a logical state of "one", and RWB is at logic state of "zero", switch network 649 drives control line 696 to "zero" volts. Independently, control line 213 is driven to a logic one level, thereby placing clamp transistors 616, 617, 618, 619, 620, and 621 in cut-off and program switches 226 in conduction state resulting in programming of RMEs 210 labeled as $R_{bit5}$, $R_{bit4}$, $R_{bit3}$, $R_{bit2}$, $R_{bit1}$, and $R_{bit0}$.

In MNVDAC 600, a resistance Rbit of the resistive memory element 210 can be either set to a logical "0" state, resulting in a low resistance setting, R, or set to a logical "1" state, resulting in a high resistance setting, R+ΔR. Therefore, Rbit can be stated as $$R_{bit} = R + \Delta R * d_{n'}$$

where n' is a non-negative integer. In a logical "0" state Rbit=R, since $d_{n'}=0$, and in a logical "1" state Rbit=R+ΔR, since $d_{n'}=1$. Consequently, currents I5, I4, I3, I2, I1, and I0 are stated as $$I_5 = \frac{V_{clamp} - V_{tn}}{R + \Delta R * (d_5 * RWB + d_{11} * RW)} = \frac{V_b}{R + \Delta R * (d_5 * RWB + d_{11} * RW)}$$

$$I_4 = \frac{V_{clamp} - V_{tn}}{R + \Delta R * (d_4 * RWB + d_{10} * RW)} = \frac{V_b}{R + \Delta R * (d_4 * RWB + d_{10} * RW)}$$

$$I_3 = \frac{V_{clamp} - V_{tn}}{R + \Delta R * (d_3 * RWB + d_9 * RW)} = \frac{V_b}{R + \Delta R * (d_3 * RWB + d_9 * RW)}$$

$$I_2 = \frac{V_{clamp} - V_{tn}}{R + \Delta R * (d_2 * RWB + d_8 * RW)} = \frac{V_b}{R + \Delta R * (d_2 * RWB + d_8 * RW)}$$

$$I_1 = \frac{V_{clamp} - V_{tn}}{R + \Delta R * (d_1 * RWB + d_7 * RW)} = \frac{V_b}{R + \Delta R * (d_1 * RWB + d_7 * RW)}$$

$$I_0 = \frac{V_{clamp} - V_{tn}}{R + \Delta R * (d_0 * RWB + d_6 * RW)} = \frac{V_b}{R + \Delta R * (d_0 * RWB + d_6 * RW)}$$

Above listed equations for currents I0, I1, I2, I3, I4 and I5 demonstrate that they are a function of input digital code or data written into twelve RMEs coupled to one word line. Subsequently, currents I0, I1, I2, I3, I4, and I5 are further processed in binarizer 668, where they are unarily and binarily weighted in a manner that corresponds to the significance of that bit in the digital input data, which was written into twelve RMEs during alternating program cycles. That is, binary current I0 as a function of d0 or d6, I1 as a function of d1 or d7, and I2 as a function of d2 or d8 get multiplied by $2^0$, $2^1$, $2^2$ units of current, respectively. In addition, unary current I3 as a function of d3 or d9, I4 as a function of d4 or d10, and I5 as a function of d5 or d11 get multiplied by $2^3$, $2^3$, and $2^3$ units of current, respectively. Furthermore, currents I0, I1, I2, I3, I4 and I5 can be amplified in addition to receiving binary and unary weights. This translates into a base binarizer 668 gain, which increases effective RME signal and multiplies least-significant-bit (LSB) current by a factor k. As a result, outputs of the binarizer 668 are stated as $$I_{u2} = 8 * k * \frac{V_b}{R + \Delta R * (d_5 * RWB + d_{11} * RW)}$$

$$I_{u1} = 8 * k * \frac{V_b}{R + \Delta R * (d_4 * RWB + d_{10} * RW)}$$

$$I_{u0} = 8 * k * \frac{V_b}{R + \Delta R * (d_3 * RWB + d_9 * RW)}$$

$$I_{b2} = 4 * k * \frac{V_b}{R + \Delta R * (d_2 * RWB + d_8 * RW)}$$

$$I_{b1} = 2 * k * \frac{V_b}{R + \Delta R * (d_1 * RWB + d_7 * RW)}$$

$$I_{b0} = k * \frac{V_b}{R + \Delta R * (d_0 * RWB + d_6 * RW)}$$

In general, binarizer 668 output currents can be stated a $$I_{u_{n-m-1}} = 2^{n-m} * k * \frac{V_b}{R + \Delta R * (d_{2^m-1+n-m-1} * RWB + d_{2^m+1+n-m-1} * RW)}$$

$$I_{u_{n-m-2}} = 2^{n-m} * k * \frac{V_b}{R + \Delta R * (d_{2^m-1+n-m-2} * RWB + d_{2^m+1+n-m-2} * RW)}$$

$$I_{u_{n-m-3}} = 2^{n-m} * k * \frac{V_b}{R + \Delta R * (d_{2^m-1+n-m-3} * RWB + d_{2^m+1+n-m-3} * RW)}$$

$$\vdots$$

$$I_{b_{n-m-1}} = 2^{n-m-1} * k * \frac{V_b}{R + \Delta R * (d_{2^m-1+n-m-4} * RWB + d_{2^m+1+n-m-4} * RW)}$$

$$I_{b_{n-m-2}} = 2^{n-m-2} * k * \frac{V_b}{R + \Delta R * (d_{2^m-1+n-m-5} * RWB + d_{2^m+1+n-m-5} * RW)}$$

$$I_{b_{n-m-3}} = 2^{n-m-3} * k * \frac{V_b}{R + \Delta R * (d_{2^m-1+n-m-6} * RWB + d_{2^m+1+n-m-6} * RW)}$$

$$\vdots$$

where n is the number of bits that are converted, m is the number of thermometer coded bits, n-m is the number of binary coded bits, and k is the gain factor. For example k=1 will result in gain of one with weights of 1, 2, 4, 8, 8 and 8, whereas m=2 will result in weights of 2, 4, 8, 16, 16, and 16. Gain factor k can be written as $k=2^p$, where p is an additional bit of resolution for MNVDAC 600 above and beyond the inherent n bits. At p=0, k=1 and no additional resolution is achieved, and there is no change in signal-to-noise-ratio (SNR), but at p=1, k=2 and one additional bit of resolution is achieved and there is a 6 db increase in SNR. Variable p can be any positive real number.

In binarizer 668 currents I0, I1, I2, I3, I4 and I5 are binarily and unarily weighted and amplified via current mirrors formed by PMOS transistor pairs such as 670 and 678. Pair 670 and 678 multiplies current I5 by eight since the width W of PMOS transistor 678 is 8 times width W of PMOS transistor 670. Similarly, PMOS transistor pair 671 and 677 has a one to eight relationship, PMOS transistor pair 672 and 676 has a one to eight width W ratio, PMOS transistor pair 673 and 681 has a one to four width W ratio, PMOS transistor pair 674 and 680 has a one to two width W ratio, and PMOS transistor pair 675 and 679 has a one to one width W ratio.

MNVDAC 600 is a segmented five bit DAC which includes twelve memory cells 215, twelve clamp transistors, six weighted current mirrors or conveyors, a six input summer, and a current to voltage converter. Therefore, the system and methodology of MNVDAC 600 is capable of converting five bits of stored digital data to an analog value. It should be understood by those skilled in the art that a higher or lower number of stored bits of data can be converted through simple modifications. For example, an eight bit segmented DAC with a 3 bit thermometer coded 1×7 array and a 5 bit binary coded 1×5 array can be implemented. This 8 bit DAC conversion path would include twenty-four memory cells 215, twenty-four clamp transistors, twelve weighted current mirrors or conveyors, a twelve input summer, and a current to voltage converter.

The non-volatile digital-to-analog converter architectures and systems disclosed herein greatly remove existing obstacles to faster, higher density, and reduced area digital-to-analog converters. Practitioners of ordinary skill in the art will further appreciate that the various illustrative logical blocks, configurations, modules, circuits, and algorithm steps described in connection with the embodiments disclosed herein may be implemented as electronic hardware, computer software, or combination of both.

Those skilled in the art may implement the described functionality in varying ways for each particular application, but such implementation decisions should not be interpreted as causing a departure from the scope of the present disclosure. In places where the description above refers to specific embodiments of memory devices and related methods, one or more or many modifications may be made without departing from the spirit and scope thereof. Details of any specific embodiment/implementation described herein may, wherever possible, be applied to any other specific implementation/embodiment described herein.

What is claimed is:

1. A digital to analog converter, comprising:
   a plurality of memory cells, each memory cell comprising a resistive memory element programmable between a high resistance state and a low resistance state;
   a binarizer electrically coupled to the plurality of memory cells and configured to receive memory cell outputs from the plurality of memory cells, each memory cell output corresponding with one of the memory cells, the binarizer further configured to generate binary weighted memory cell outputs;
   wherein the binary weighted memory cell outputs comprise each of at least a first subset of the memory cell outputs multiplied by one of a plurality of distinct multipliers;
   a summer electrically coupled to the binarizer and configured to sum the binary weighted memory cell outputs into an analog current signal, and;
   a current to voltage converter coupled with the summer and configured to convert the analog current signal to an analog voltage signal.

2. The device of claim 1, wherein each of the distinct multipliers comprises a base of 2 raised to a whole number exponent distinct from the whole number exponent of every other distinct multiplier.

3. The device of claim 1, wherein all of the memory cell outputs are converted to binary weighted memory cell outputs by the binarizer.

4. The device of claim 1, wherein the binarizer is further configured to generate unary weighted memory cell outputs, wherein the unary weighted memory cell outputs comprise each of a second subset of the memory cell outputs multiplied by an identical multiplier, and wherein the summer is configured to sum the binary weighted memory cell outputs and the unary weighted memory cell outputs into the analog current signal.

5. The device of claim 4, wherein the identical multiplier comprises a base of 2 raised to a whole number exponent.

6. The device of claim 4, wherein the plurality of memory cells form bit lines, and wherein the device further comprises a first plurality of switches configured to couple a first subset of the bit lines with a plurality of voltage sources and a second plurality of switches configured to couple a second subset of the bit lines with the plurality of voltage sources.

7. The device of claim 1, wherein the plurality of memory cells form bit lines, and wherein the device further comprises a first plurality of switches configured to couple a first subset of the bit lines with a plurality of voltage sources and a second plurality of switches configured to couple a second subset of the bit lines with the plurality of voltage sources.

8. The device of claim 1, further comprising a decoder electrically coupled to a plurality of word lines comprised in the plurality of memory cells, the decoder configured to decode an address input to select one of the word lines comprised in the plurality of memory cells.

9. The device of claim 1, wherein the binarizer comprises at least one voltage clamping transistor and at least one pair of load transistors, wherein the at least one pair of load transistors is configured to weight, through a current mirror (current conveyor) configured to copy and multiply currents, a current corresponding with at least one of the memory cells.

10. The device of claim 1, wherein the analog voltage signal corresponds with data stored on a word line of the plurality of memory cells.

11. The device of claim 1, wherein each resistive memory element comprises a resistive device electrically coupled to an isolation transistor.

12. The device of claim 1, wherein none of the memory cells comprises an isolation switch.

13. The device of claim 1, wherein each of the plurality of memory cells is physically identical.

14. A digital to analog converter, comprising:
    a plurality of memory cells, each memory cell comprising a resistive memory element programmable between a high resistance state and a low resistance state, wherein the plurality of memory cells is segmented into a unary (thermometer) coded segment and a binary coded segment;
    a summer electrically coupled with the plurality of memory cells and configured to sum memory cell outputs from the plurality of memory cells into an analog current signal, and;
    a current to voltage converter coupled with the summer and configured to convert the analog current signal to an analog voltage signal.

15. The device of claim 14, further comprising a binarizer electrically coupled to the plurality of memory cells and configured to receive the memory cell outputs from the plurality of memory cells, each memory cell output corresponding with one of the memory cells; the binarizer further configured to generate a plurality of binary weighted memory cell outputs, each binary weighted memory cell output comprising one of the memory cell outputs from one of the memory cells of the binary coded segment that is multiplied by one of a plurality of distinct multipliers; the binarizer further configured to generate a plurality of unary weighted memory cell outputs, each unary weighted memory cell output comprising one of the memory cell outputs from one of the memory cells of the unary coded segment that is multiplied by a multiplier identical to a multiplier of every other unary weighted memory cell (identical multiplier); and wherein the summer is configured to sum the unary weighted memory cell outputs and the binary weighted memory cell outputs into the analog current signal.

16. The device of claim 15, wherein the plurality of memory cells form bit lines, and wherein the device further comprises a first plurality of switches configured to couple a first subset of the bit lines with a plurality of voltage sources and a second plurality of switches configured to couple a second subset of the bit lines with the plurality of voltage sources.

17. The device of claim 16, wherein the first plurality of switches and the second plurality of switches comprise an inverse relationship such that when the first plurality of switches is open the second plurality of switches is closed and vice versa.

18. A method of using a digital to analog converter, comprising:
providing a plurality of memory cells, each memory cell comprising a resistive memory element programmable between a high resistance state and a low resistance state, wherein the plurality of memory cells is segmented into a unary (thermometer) coded segment and a binary coded segment;
summing memory cell outputs from the plurality of memory cells, with a summer electrically coupled with the plurality of memory cells, into an analog current signal, and;
converting the analog current signal into an analog voltage signal using a current to voltage converter electrically coupled with the summer.

19. The method of claim 18, further comprising: receiving the memory cell outputs, from the plurality of memory cells, at a binarizer electrically coupled with the plurality of memory cells, each memory cell output corresponding with one of the memory cells; generating, using the binarizer, a plurality of binary weighted memory cell outputs, each binary weighted memory cell output comprising one of the memory cell outputs from one of the memory cells of the binary coded segment that is multiplied by one of a plurality of distinct multipliers; generating, using the binarizer, a plurality of unary weighted memory cell outputs, each unary weighted memory cell output comprising one of the memory cell outputs from one of the memory cells of the unary coded segment that is multiplied by a multiplier identical to a multiplier of every other unary weighted memory cell (identical multiplier), and; summing, using the summer, the unary weighted memory cell outputs and the binary weighted memory cell outputs into the analog current signal.

20. The method of claim 18, wherein the plurality of memory cells form bit lines, and wherein the method further comprises: coupling a first plurality of switches with the device so that the first plurality of switches is configured to couple a first subset of the bit lines with a plurality of voltage sources; coupling a second plurality of switches with the device so that the second plurality of switches is configured to couple a second subset of the bit lines with the plurality of voltage sources, wherein the first plurality of switches and the second plurality of switches comprise an inverse relationship such that when the first plurality of switches is open the second plurality of switches is closed and vice versa.

* * * * *